(12) United States Patent
Terashima

(10) Patent No.: US 8,258,988 B2
(45) Date of Patent: Sep. 4, 2012

(54) ENCODING APPARATUS, ENCODING METHOD, AND PROGRAM

(75) Inventor: Toru Terashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 56 days.

(21) Appl. No.: 12/909,604

(22) Filed: Oct. 21, 2010

(65) Prior Publication Data

US 2011/0102208 A1    May 5, 2011

(30) Foreign Application Priority Data

Oct. 30, 2009    (JP) ................. 2009-250804

(51) Int. Cl.
*H03M 5/02*    (2006.01)
(52) U.S. Cl. ........................... 341/56; 341/58
(58) Field of Classification Search ............ 341/56, 341/58
See application file for complete search history.

(56) References Cited

U.S. PATENT DOCUMENTS

| | | | | |
|---|---|---|---|---|
| 5,331,320 A | * | 7/1994 | Cideciyan et al. | 341/56 |
| 5,633,631 A | * | 5/1997 | Teckman | 341/58 |
| 5,684,833 A | * | 11/1997 | Watanabe | 375/286 |
| 5,784,409 A | * | 7/1998 | Coles | 375/286 |
| 7,221,711 B2 | * | 5/2007 | Woodworth | 375/246 |

FOREIGN PATENT DOCUMENTS

JP    03-109843    5/1991

* cited by examiner

*Primary Examiner* — Khai M Nguyen

(74) *Attorney, Agent, or Firm* — Wolf, Greenfield & Sacks, P.C.

(57) ABSTRACT

Provided is an encoding apparatus including an encoding unit that converts, based on a first conversion rule group according to which a total value for a base-K symbol sequence is X and a second conversion rule group according to which the total value for the base-K symbol sequence is −X among conversion rule groups for converting an L-bit bit sequence into the base-K symbol sequence (K>2) of N/2 symbol, an M-bit (M≧2*L) bit sequence into the base-K symbol sequence of N symbols. When converting the M-bit bit sequence into the base-K symbol sequence of N symbols, the encoding unit converts a first-half N/2 symbol based on the first conversion rule group and converts a second-half N/2 symbol based on the second conversion rule group.

7 Claims, 26 Drawing Sheets

14B8Q CONVERSION({b0, · · · ,b13}→{q0, · · · ,q7})

(M=14)

| b13 | b12 | b11 | b10 | b9 | b8 | b7 | b6 | b5 | b4 | b3 | b2 | b1 | b0 |
|---|---|---|---|---|---|---|---|---|---|---|---|---|---|

14B8Q CONVERSION (N=8)

| q7 | q6 | q5 | q4 | q3 | q2 | q1 | q0 |
|---|---|---|---|---|---|---|---|

SYMBOL DIVISION + DC COMPENSATION

FIG. 6

TABLE1: DC VALUE AND NUMBER OF COMBINATIONS (14B8Q)

| DC VALUE | NUMBER OF COMBINATIONS |
|---|---|
| 0 | 85 |
| +1 | 80 |
| −1 | 80 |
| +2 | 68 |
| −2 | 68 |
| +3 | 52 |
| −3 | 52 |
| +4 | 35 |
| −4 | 35 |
| +5 | 20 |
| −5 | 20 |
| +6 | 10 |
| −6 | 10 |
| +7 | 4 |
| −7 | 4 |
| +8 | 1 |
| −8 | 1 |

FIG. 7

TABLE2 : FIRST-HALF/SECOND-HALF COMBINATION PATTERNS (14B8Q)

| FIRST HALF | SECOND HALF | NUMBER OF COMBINATIONS |
|---|---|---|
| DC VALUE = 0 | DC VALUE = 0 | 7225 |
| DC VALUE = +1 | DC VALUE = −1 | 6400 |
| DC VALUE = −1 | DC VALUE = +1 | 6400 |
| DC VALUE = +2 | DC VALUE = −2 | 4624 |
| DC VALUE = −2 | DC VALUE = +2 | 4624 |
| DC VALUE = +3 | DC VALUE = −3 | 2524 |
| DC VALUE = −3 | DC VALUE = +3 | 2524 |
| DC VALUE = +4 | DC VALUE = −4 | 1225 |
| DC VALUE = −4 | DC VALUE = +4 | 1225 |
| DC VALUE = +5 | DC VALUE = −5 | 400 |
| DC VALUE = −5 | DC VALUE = +5 | 400 |
| DC VALUE = +6 | DC VALUE = −6 | 100 |
| DC VALUE = −6 | DC VALUE = +6 | 100 |
| DC VALUE = +7 | DC VALUE = −7 | 16 |
| DC VALUE = −7 | DC VALUE = +7 | 16 |
| DC VALUE = +8 | DC VALUE = −8 | 1 |
| DC VALUE = −8 | DC VALUE = +8 | 1 |
| TOTAL | | 38165 |

FIG. 8

| TABLE A (14B8Q) | | | | | | | | | |
|---|---|---|---|---|---|---|---|---|---|
| 00000 | -2 | -1 | 1 | 2 | 10000 | -1 | 0 | 1 | 0 |
| 00001 | -2 | -1 | 2 | 1 | 10001 | -1 | 0 | 2 | -1 |
| 00010 | -2 | 0 | 0 | 2 | 10010 | -1 | 1 | -2 | 2 |
| 00011 | -2 | 0 | 2 | 0 | 10011 | -1 | 1 | -1 | 1 |
| 00100 | -2 | 1 | -1 | 2 | 10100 | -1 | 1 | 1 | -1 |
| 00101 | -2 | 1 | 0 | 1 | 10101 | -1 | 1 | 2 | -2 |
| 00110 | -2 | 1 | 1 | 0 | 10110 | -1 | 2 | -2 | 1 |
| 00111 | -2 | 1 | 2 | -1 | 10111 | -1 | 2 | -1 | 0 |
| 01000 | -2 | 2 | -2 | 2 | 11000 | -1 | 2 | 0 | -1 |
| 01001 | -2 | 2 | -1 | 1 | 11001 | -1 | 2 | 1 | -2 |
| 01010 | -2 | 2 | 1 | -1 | 11010 | 0 | -2 | 0 | 2 |
| 01011 | -2 | 2 | 2 | -2 | 11011 | 0 | -2 | 2 | 0 |
| 01100 | -1 | -2 | 1 | 2 | 11100 | 0 | -1 | -1 | 2 |
| 01101 | -1 | -2 | 2 | 1 | 11101 | 0 | -1 | 0 | 1 |
| 01110 | -1 | 0 | -1 | 2 | 11110 | 0 | -1 | 1 | 0 |
| 01111 | -1 | 0 | 0 | 1 | 11111 | 0 | -1 | 2 | -1 |

FIG. 9

| TABLE B (14B8Q) | | | | | | | | | |
|---|---|---|---|---|---|---|---|---|---|
| 00000 | -2 | 0 | 1 | 2 | 10000 | -1 | 2 | -1 | 1 |
| 00001 | -2 | 0 | 2 | 1 | 10001 | 0 | -2 | 1 | 2 |
| 00010 | -2 | 1 | 0 | 2 | 10010 | 0 | -2 | 2 | 1 |
| 00011 | -2 | 1 | 2 | 0 | 10011 | 0 | -1 | 0 | 2 |
| 00100 | -2 | 2 | -1 | 2 | 10100 | 0 | -1 | 1 | 1 |
| 00101 | -2 | 2 | 0 | 1 | 10101 | 0 | -1 | 2 | 0 |
| 00110 | -2 | 2 | 1 | 0 | 10110 | 0 | 0 | -1 | 2 |
| 00111 | -2 | 2 | 2 | -1 | 10111 | 0 | 1 | -2 | 2 |
| 01000 | -1 | 0 | 0 | 2 | 11000 | 0 | 1 | -1 | 1 |
| 01001 | -1 | 0 | 1 | 1 | 11001 | 0 | 2 | -2 | 1 |
| 01010 | -1 | 0 | 2 | 0 | 11010 | 1 | -2 | 0 | 2 |
| 01011 | -1 | 1 | -1 | 2 | 11011 | 1 | -2 | 1 | 1 |
| 01100 | -1 | 1 | 0 | 1 | 11100 | 1 | -1 | -1 | 2 |
| 01101 | -1 | 1 | 1 | 0 | 11101 | 1 | -1 | 0 | 1 |
| 01110 | -1 | 1 | 2 | -1 | 11110 | 1 | 0 | -2 | 2 |
| 01111 | -1 | 2 | -2 | 2 | 11111 | 2 | -2 | -1 | 2 |

FIG. 10

| TABLE C (14B8Q) | | | | |
|---|---|---|---|---|
| 0000 | −1 | 0 | 1 | 2 |
| 0001 | −1 | 0 | 2 | 1 |
| 0010 | −1 | 1 | 0 | 2 |
| 0011 | −1 | 1 | 2 | 0 |
| 0100 | −1 | 2 | −1 | 2 |
| 0101 | −1 | 2 | 0 | 1 |
| 0110 | −1 | 2 | 1 | 0 |
| 0111 | 0 | −1 | 1 | 2 |
| 1000 | 0 | −1 | 2 | 1 |
| 1001 | 0 | 1 | −1 | 2 |
| 1010 | 0 | 2 | −2 | 2 |
| 1011 | 0 | 2 | −1 | 1 |
| 1100 | 1 | −2 | 1 | 2 |
| 1101 | 1 | −2 | 2 | 1 |
| 1110 | 1 | −1 | 0 | 2 |
| 1111 | 1 | 0 | −1 | 2 |

FIG. 11

| TABLE D (14B8Q) | | | | |
|---|---|---|---|---|
| 0000 | −2 | 2 | 1 | 2 |
| 0001 | −2 | 2 | 2 | 1 |
| 0010 | −1 | 1 | 1 | 2 |
| 0011 | −1 | 1 | 2 | 1 |
| 0100 | −1 | 2 | 0 | 2 |
| 0101 | −1 | 2 | 1 | 1 |
| 0110 | −1 | 2 | 2 | 0 |
| 0111 | 0 | −1 | 2 | 2 |
| 1000 | 0 | 2 | −1 | 2 |
| 1001 | 1 | −2 | 2 | 2 |
| 1010 | 1 | −1 | 1 | 2 |
| 1011 | 1 | −1 | 2 | 1 |
| 1100 | 1 | 1 | −1 | 2 |
| 1101 | 1 | 2 | −2 | 2 |
| 1110 | 2 | −2 | 1 | 2 |
| 1111 | 2 | −1 | 0 | 2 |

SYMBOL DIVISION + DC COMPENSATION

FIG. 19

| TABLE A (12B8Q) | | | | |
|---|---|---|---|---|
| 0000 | −1.5 | 0.5 | −0.5 | 1.5 |
| 0001 | −1.5 | 0.5 | 1.5 | −0.5 |
| 0010 | −1.5 | 1.5 | −1.5 | 1.5 |
| 0011 | −1.5 | 1.5 | −0.5 | 0.5 |
| 0100 | −1.5 | 1.5 | 0.5 | −0.5 |
| 0101 | −1.5 | 1.5 | 1.5 | −1.5 |
| 0110 | −0.5 | −1.5 | 0.5 | 1.5 |
| 0111 | −0.5 | −1.5 | 1.5 | 0.5 |
| 1000 | −0.5 | −0.5 | 0.5 | 0.5 |
| 1001 | −0.5 | 0.5 | −1.5 | 1.5 |
| 1010 | −0.5 | 0.5 | −0.5 | 0.5 |
| 1011 | −0.5 | 0.5 | 0.5 | −0.5 |
| 1100 | −0.5 | 0.5 | 1.5 | −1.5 |
| 1101 | −0.5 | 1.5 | −1.5 | 0.5 |
| 1110 | −0.5 | 1.5 | −0.5 | −0.5 |
| 1111 | −0.5 | 1.5 | 0.5 | −1.5 |

FIG. 20

| TABLE B (12B8Q) | | | | |
|---|---|---|---|---|
| 0000 | −1.5 | −0.5 | 1.5 | 1.5 |
| 0001 | −1.5 | 1.5 | −0.5 | 1.5 |
| 0010 | −1.5 | 1.5 | 1.5 | −0.5 |
| 0011 | −0.5 | −1.5 | 1.5 | 1.5 |
| 0100 | −0.5 | −0.5 | 0.5 | 1.5 |
| 0101 | −0.5 | −0.5 | 1.5 | 0.5 |
| 0110 | −0.5 | 0.5 | −0.5 | 1.5 |
| 0111 | −0.5 | 0.5 | 1.5 | −0.5 |
| 1000 | −0.5 | 1.5 | −1.5 | 1.5 |
| 1001 | −0.5 | 1.5 | −0.5 | 0.5 |
| 1010 | 0.5 | −1.5 | 0.5 | 1.5 |
| 1011 | 0.5 | −1.5 | 1.5 | 0.5 |
| 1100 | 0.5 | −0.5 | −0.5 | 1.5 |
| 1101 | 0.5 | −0.5 | 0.5 | 0.5 |
| 1110 | 0.5 | 0.5 | −1.5 | 1.5 |
| 1111 | 1.5 | −1.5 | −0.5 | 1.5 |

FIG. 21

| TABLE C (12B8Q) | | | | |
|---|---|---|---|---|
| 000 | −0.5 | −0.5 | 1.5 | 1.5 |
| 001 | −0.5 | 1.5 | −0.5 | 1.5 |
| 010 | 0.5 | −1.5 | 1.5 | 1.5 |
| 011 | 0.5 | −0.5 | 0.5 | 1.5 |
| 100 | 0.5 | −0.5 | 1.5 | 0.5 |
| 101 | 0.5 | 0.5 | −0.5 | 1.5 |
| 110 | 0.5 | 1.5 | −1.5 | 1.5 |
| 111 | 1.5 | −1.5 | 0.5 | 1.5 |

FIG. 22

| TABLE D (12B8Q) | | | | |
|---|---|---|---|---|
| 000 | −1.5 | 1.5 | 1.5 | 1.5 |
| 001 | −0.5 | 0.5 | 1.5 | 1.5 |
| 010 | −0.5 | 1.5 | 0.5 | 1.5 |
| 011 | −0.5 | 1.5 | 1.5 | 0.5 |
| 100 | 0.5 | −0.5 | 1.5 | 1.5 |
| 101 | 0.5 | 1.5 | −0.5 | 1.5 |
| 110 | 1.5 | −1.5 | 1.5 | 1.5 |
| 111 | 1.5 | −0.5 | 0.5 | 1.5 |

FIG. 23    TABLE A GENERATION METHOD(12B8Q)

| (A1) DC=0 | | | | (A2) EXCLUSION OF PATTERN IDENTICAL WHEN SIGN IS REVERSED | | | | UNUSED |
|---|---|---|---|---|---|---|---|---|
| -1.5 | -1.5 | 1.5 | 1.5 | -1.5 | -1.5 | 1.5 | 1.5 | * |
| -1.5 | -0.5 | 0.5 | 1.5 | -1.5 | -0.5 | 0.5 | 1.5 | * |
| -1.5 | -0.5 | 1.5 | 0.5 | -1.5 | -0.5 | 1.5 | 0.5 | * |
| -1.5 | 0.5 | -0.5 | 1.5 | -1.5 | 0.5 | -0.5 | 1.5 | |
| -1.5 | 0.5 | 0.5 | 0.5 | -1.5 | 0.5 | 0.5 | 0.5 | * |
| -1.5 | 0.5 | 1.5 | -0.5 | -1.5 | 0.5 | 1.5 | -0.5 | |
| -1.5 | 1.5 | -1.5 | 1.5 | -1.5 | 1.5 | -1.5 | 1.5 | |
| -1.5 | 1.5 | -0.5 | 0.5 | -1.5 | 1.5 | -0.5 | 0.5 | |
| -1.5 | 1.5 | 0.5 | -0.5 | -1.5 | 1.5 | 0.5 | -0.5 | |
| -1.5 | 1.5 | 1.5 | -1.5 | -1.5 | 1.5 | 1.5 | -1.5 | |
| -0.5 | -1.5 | 0.5 | 1.5 | -0.5 | -1.5 | 0.5 | 1.5 | |
| -0.5 | -1.5 | 1.5 | 0.5 | -0.5 | -1.5 | 1.5 | 0.5 | |
| -0.5 | -0.5 | -0.5 | 1.5 | -0.5 | -0.5 | -0.5 | 1.5 | * |
| -0.5 | -0.5 | 0.5 | 0.5 | -0.5 | -0.5 | 0.5 | 0.5 | |
| -0.5 | -0.5 | 1.5 | -0.5 | -0.5 | -0.5 | 1.5 | -0.5 | * |
| -0.5 | 0.5 | -1.5 | 1.5 | -0.5 | 0.5 | -1.5 | 1.5 | |
| -0.5 | 0.5 | -0.5 | 0.5 | -0.5 | 0.5 | -0.5 | 0.5 | |
| -0.5 | 0.5 | 0.5 | -0.5 | -0.5 | 0.5 | 0.5 | -0.5 | |
| -0.5 | 0.5 | 1.5 | -1.5 | -0.5 | 0.5 | 1.5 | -1.5 | |
| -0.5 | 1.5 | -1.5 | 0.5 | -0.5 | 1.5 | -1.5 | 0.5 | |
| -0.5 | 1.5 | -0.5 | -0.5 | -0.5 | 1.5 | -0.5 | -0.5 | |
| -0.5 | 1.5 | 0.5 | -1.5 | -0.5 | 1.5 | 0.5 | -1.5 | |
| 0.5 | -1.5 | -0.5 | 1.5 | | | | | |
| 0.5 | -1.5 | 0.5 | 0.5 | | | | | |
| 0.5 | -1.5 | 1.5 | -0.5 | | | | | |
| 0.5 | -0.5 | -1.5 | 1.5 | | | | | |
| 0.5 | -0.5 | -0.5 | 0.5 | | | | | |
| 0.5 | -0.5 | 0.5 | -0.5 | | | | | |
| 0.5 | -0.5 | 1.5 | -1.5 | | | | | |
| 0.5 | 0.5 | -1.5 | 0.5 | | | | | |
| 0.5 | 0.5 | -0.5 | -0.5 | | | | | |
| 0.5 | 0.5 | 0.5 | -1.5 | | | | | |
| 0.5 | 1.5 | -1.5 | -0.5 | | | | | |
| 0.5 | 1.5 | -0.5 | -1.5 | | | | | |
| 1.5 | -1.5 | -1.5 | 1.5 | | | | | |
| 1.5 | -1.5 | -0.5 | 0.5 | | | | | |
| 1.5 | -1.5 | 0.5 | -0.5 | | | | | |
| 1.5 | -1.5 | 1.5 | -1.5 | | | | | |
| 1.5 | -0.5 | -1.5 | 0.5 | | | | | |
| 1.5 | -0.5 | -0.5 | -0.5 | | | | | |
| 1.5 | -0.5 | 0.5 | -1.5 | | | | | |
| 1.5 | 0.5 | -1.5 | -0.5 | | | | | |
| 1.5 | 0.5 | -0.5 | -1.5 | | | | | |
| 1.5 | 1.5 | -1.5 | -1.5 | | | | | |

FIG. 24

TABLE B GENERATION METHOD(12B8Q)

| (B1) DC=1 | | | | (B2) EXCLUSION OF PATTERN IDENTICAL WHEN ORDER IS REVERSED | | | | UNUSED |
|---|---|---|---|---|---|---|---|---|
| -1.5 | -0.5 | 1.5 | 1.5 | -1.5 | -0.5 | 1.5 | 1.5 | |
| -1.5 | 0.5 | 0.5 | 1.5 | -1.5 | 0.5 | 0.5 | 1.5 | * |
| -1.5 | 0.5 | 1.5 | 0.5 | -1.5 | 0.5 | 1.5 | 0.5 | * |
| -1.5 | 1.5 | -0.5 | 1.5 | -1.5 | 1.5 | -0.5 | 1.5 | |
| -1.5 | 1.5 | 0.5 | 0.5 | -1.5 | 1.5 | 0.5 | 0.5 | * |
| -1.5 | 1.5 | 1.5 | -0.5 | -1.5 | 1.5 | 1.5 | -0.5 | |
| -0.5 | -1.5 | 1.5 | 1.5 | -0.5 | -1.5 | 1.5 | 1.5 | |
| -0.5 | -0.5 | 0.5 | 1.5 | -0.5 | -0.5 | 0.5 | 1.5 | |
| -0.5 | -0.5 | 1.5 | 0.5 | -0.5 | -0.5 | 1.5 | 0.5 | |
| -0.5 | 0.5 | -0.5 | 1.5 | -0.5 | 0.5 | -0.5 | 1.5 | |
| -0.5 | 0.5 | 0.5 | 0.5 | -0.5 | 0.5 | 0.5 | 0.5 | * |
| -0.5 | 0.5 | 1.5 | -0.5 | -0.5 | 0.5 | 1.5 | -0.5 | |
| -0.5 | 1.5 | -1.5 | 1.5 | -0.5 | 1.5 | -1.5 | 1.5 | |
| -0.5 | 1.5 | -0.5 | 0.5 | -0.5 | 1.5 | -0.5 | 0.5 | |
| -0.5 | 1.5 | 0.5 | -0.5 | 0.5 | -1.5 | 0.5 | 1.5 | |
| -0.5 | 1.5 | 1.5 | -1.5 | 0.5 | -1.5 | 1.5 | 0.5 | |
| 0.5 | -1.5 | 0.5 | 1.5 | 0.5 | -0.5 | -0.5 | 1.5 | |
| 0.5 | -1.5 | 1.5 | 0.5 | 0.5 | -0.5 | 0.5 | 0.5 | |
| 0.5 | -0.5 | -0.5 | 1.5 | 0.5 | 0.5 | -1.5 | 1.5 | |
| 0.5 | -0.5 | 0.5 | 0.5 | 1.5 | -1.5 | -0.5 | 1.5 | |
| 0.5 | -0.5 | 1.5 | -0.5 | | | | | |
| 0.5 | 0.5 | -1.5 | 1.5 | | | | | |
| 0.5 | 0.5 | -0.5 | 0.5 | | | | | |
| 0.5 | 0.5 | 0.5 | -0.5 | | | | | |
| 0.5 | 0.5 | 1.5 | -1.5 | | | | | |
| 0.5 | 1.5 | -1.5 | 0.5 | | | | | |
| 0.5 | 1.5 | -0.5 | -0.5 | | | | | |
| 0.5 | 1.5 | 0.5 | -1.5 | | | | | |
| 1.5 | -1.5 | -0.5 | 1.5 | | | | | |
| 1.5 | -1.5 | 0.5 | 0.5 | | | | | |
| 1.5 | -1.5 | 1.5 | -0.5 | | | | | |
| 1.5 | -0.5 | -1.5 | 1.5 | | | | | |
| 1.5 | -0.5 | -0.5 | 0.5 | | | | | |
| 1.5 | -0.5 | 0.5 | -0.5 | | | | | |
| 1.5 | -0.5 | 1.5 | -1.5 | | | | | |
| 1.5 | 0.5 | -1.5 | 0.5 | | | | | |
| 1.5 | 0.5 | -0.5 | -0.5 | | | | | |
| 1.5 | 0.5 | 0.5 | -1.5 | | | | | |
| 1.5 | 1.5 | -1.5 | -0.5 | | | | | |
| 1.5 | 1.5 | -0.5 | -1.5 | | | | | |

FIG. 25

TABLE C GENERATION METHOD(12B8Q)

| (C1) DC=2 | | | | (C2) EXCLUSION OF PATTERN IDENTICAL WHEN ORDER IS REVERSED | | | | UNUSED |
|---|---|---|---|---|---|---|---|---|
| -1.5 | 0.5 | 1.5 | 1.5 | -1.5 | 0.5 | 1.5 | 1.5 | * |
| -1.5 | 1.5 | 0.5 | 1.5 | -1.5 | 1.5 | 0.5 | 1.5 | * |
| -1.5 | 1.5 | 1.5 | 0.5 | -1.5 | 1.5 | 1.5 | 0.5 | * |
| -0.5 | -0.5 | 1.5 | 1.5 | -0.5 | -0.5 | 1.5 | 1.5 | |
| -0.5 | 0.5 | 0.5 | 1.5 | -0.5 | 0.5 | 0.5 | 1.5 | * |
| -0.5 | 0.5 | 1.5 | 0.5 | -0.5 | 0.5 | 1.5 | 0.5 | * |
| -0.5 | 1.5 | -0.5 | 1.5 | -0.5 | 1.5 | -0.5 | 1.5 | |
| -0.5 | 1.5 | 0.5 | 0.5 | -0.5 | 1.5 | 0.5 | 0.5 | * |
| -0.5 | 1.5 | 1.5 | -0.5 | -0.5 | 1.5 | 1.5 | -0.5 | * |
| 0.5 | -1.5 | 1.5 | 1.5 | 0.5 | -1.5 | 1.5 | 1.5 | |
| 0.5 | -0.5 | 0.5 | 1.5 | 0.5 | -0.5 | 0.5 | 1.5 | |
| 0.5 | -0.5 | 1.5 | 0.5 | 0.5 | -0.5 | 1.5 | 0.5 | |
| 0.5 | 0.5 | -0.5 | 1.5 | 0.5 | 0.5 | -0.5 | 1.5 | |
| 0.5 | 0.5 | 0.5 | 0.5 | 0.5 | 0.5 | 0.5 | 0.5 | * |
| 0.5 | 0.5 | 1.5 | -0.5 | 0.5 | 1.5 | -1.5 | 1.5 | |
| 0.5 | 1.5 | -1.5 | 1.5 | 1.5 | -1.5 | 0.5 | 1.5 | |
| 0.5 | 1.5 | -0.5 | 0.5 | 1.5 | -0.5 | -0.5 | 1.5 | * |
| 0.5 | 1.5 | 0.5 | -0.5 | | | | | |
| 0.5 | 1.5 | 1.5 | -1.5 | | | | | |
| 1.5 | -1.5 | 0.5 | 1.5 | | | | | |
| 1.5 | -1.5 | 1.5 | 0.5 | | | | | |
| 1.5 | -0.5 | -0.5 | 1.5 | | | | | |
| 1.5 | -0.5 | 0.5 | 0.5 | | | | | |
| 1.5 | -0.5 | 1.5 | -0.5 | | | | | |
| 1.5 | 0.5 | -1.5 | 1.5 | | | | | |
| 1.5 | 0.5 | -0.5 | 0.5 | | | | | |
| 1.5 | 0.5 | 0.5 | -0.5 | | | | | |
| 1.5 | 0.5 | 1.5 | -1.5 | | | | | |
| 1.5 | 1.5 | -1.5 | 0.5 | | | | | |
| 1.5 | 1.5 | -0.5 | -0.5 | | | | | |
| 1.5 | 1.5 | 0.5 | -1.5 | | | | | |

FIG. 26

TABLE D GENERATION METHOD(12B8Q)

| (D1) DC=3 | | | | (D2) EXCLUSION OF PATTERN IDENTICAL WHEN ORDER IS REVERSED | | | | UNUSED |
|---|---|---|---|---|---|---|---|---|
| −1.5 | 1.5 | 1.5 | 1.5 | −1.5 | 1.5 | 1.5 | 1.5 | |
| −0.5 | 0.5 | 1.5 | 1.5 | −0.5 | 0.5 | 1.5 | 1.5 | |
| −0.5 | 1.5 | 0.5 | 1.5 | −0.5 | 1.5 | 0.5 | 1.5 | |
| −0.5 | 1.5 | 1.5 | 0.5 | −0.5 | 1.5 | 1.5 | 0.5 | |
| 0.5 | −0.5 | 1.5 | 1.5 | 0.5 | −0.5 | 1.5 | 1.5 | |
| 0.5 | 0.5 | 0.5 | 1.5 | 0.5 | 0.5 | 0.5 | 1.5 | * |
| 0.5 | 0.5 | 1.5 | 0.5 | 0.5 | 0.5 | 1.5 | 0.5 | * |
| 0.5 | 1.5 | −0.5 | 1.5 | 0.5 | 1.5 | −0.5 | 1.5 | |
| 0.5 | 1.5 | 0.5 | 0.5 | 1.5 | −1.5 | 1.5 | 1.5 | |
| 0.5 | 1.5 | 1.5 | −0.5 | 1.5 | −0.5 | 0.5 | 1.5 | |
| 1.5 | −1.5 | 1.5 | 1.5 | | | | | |
| 1.5 | −0.5 | 0.5 | 1.5 | | | | | |
| 1.5 | −0.5 | 1.5 | 0.5 | | | | | |
| 1.5 | 0.5 | −0.5 | 1.5 | | | | | |
| 1.5 | 0.5 | 0.5 | 0.5 | | | | | |
| 1.5 | 0.5 | 1.5 | −0.5 | | | | | |
| 1.5 | 1.5 | −1.5 | 1.5 | | | | | |
| 1.5 | 1.5 | −0.5 | 0.5 | | | | | |
| 1.5 | 1.5 | 0.5 | −0.5 | | | | | |
| 1.5 | 1.5 | 1.5 | −1.5 | | | | | |

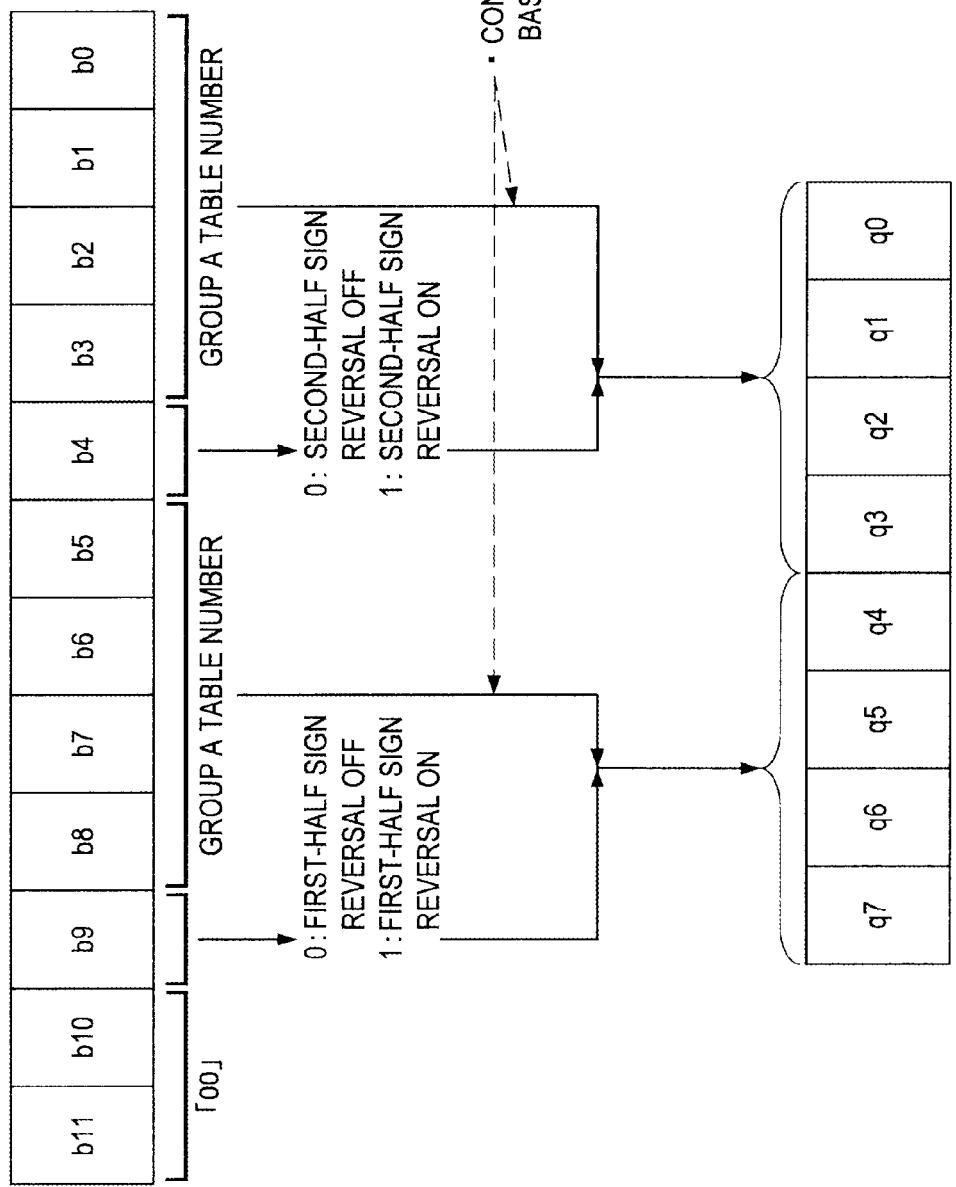

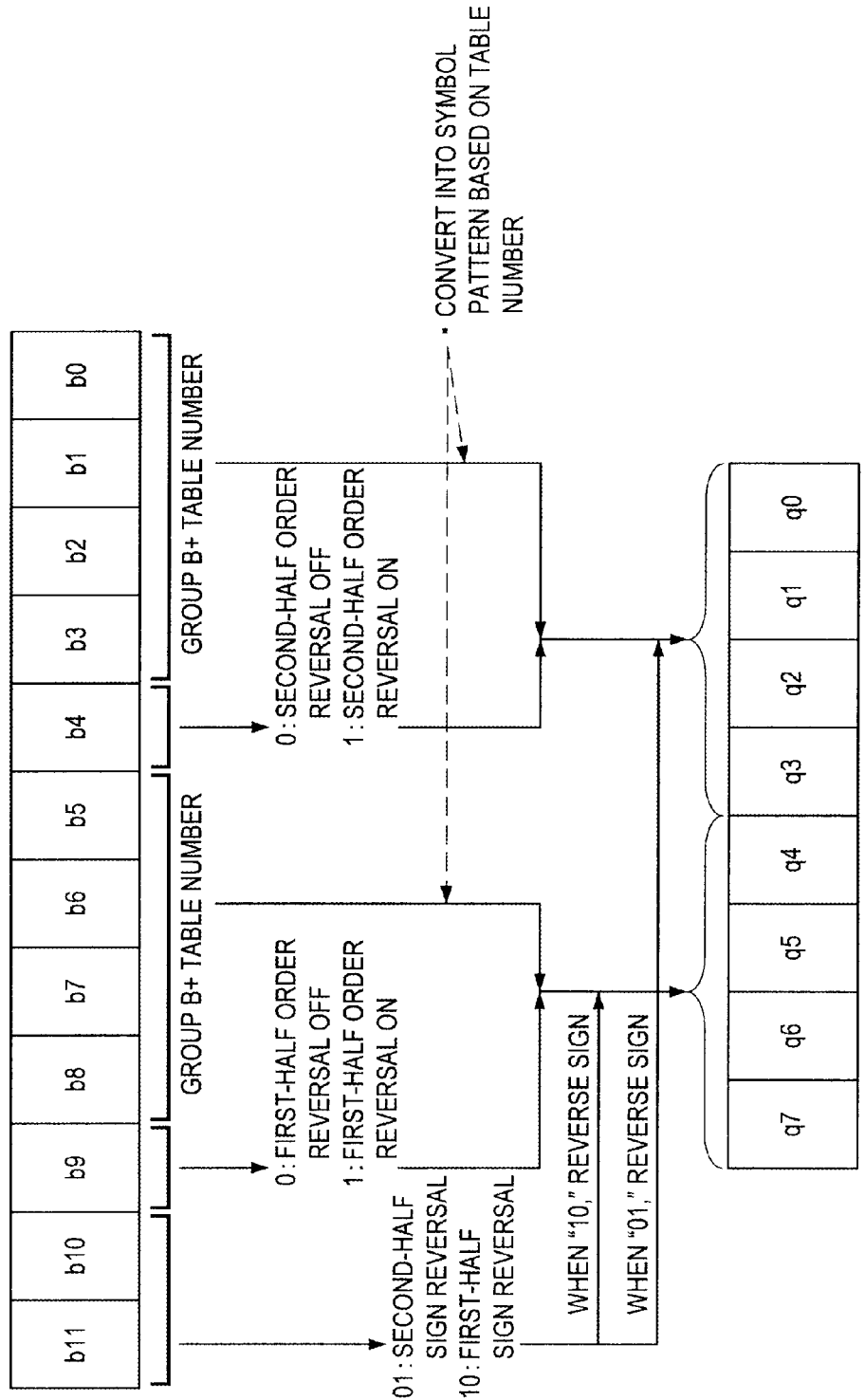

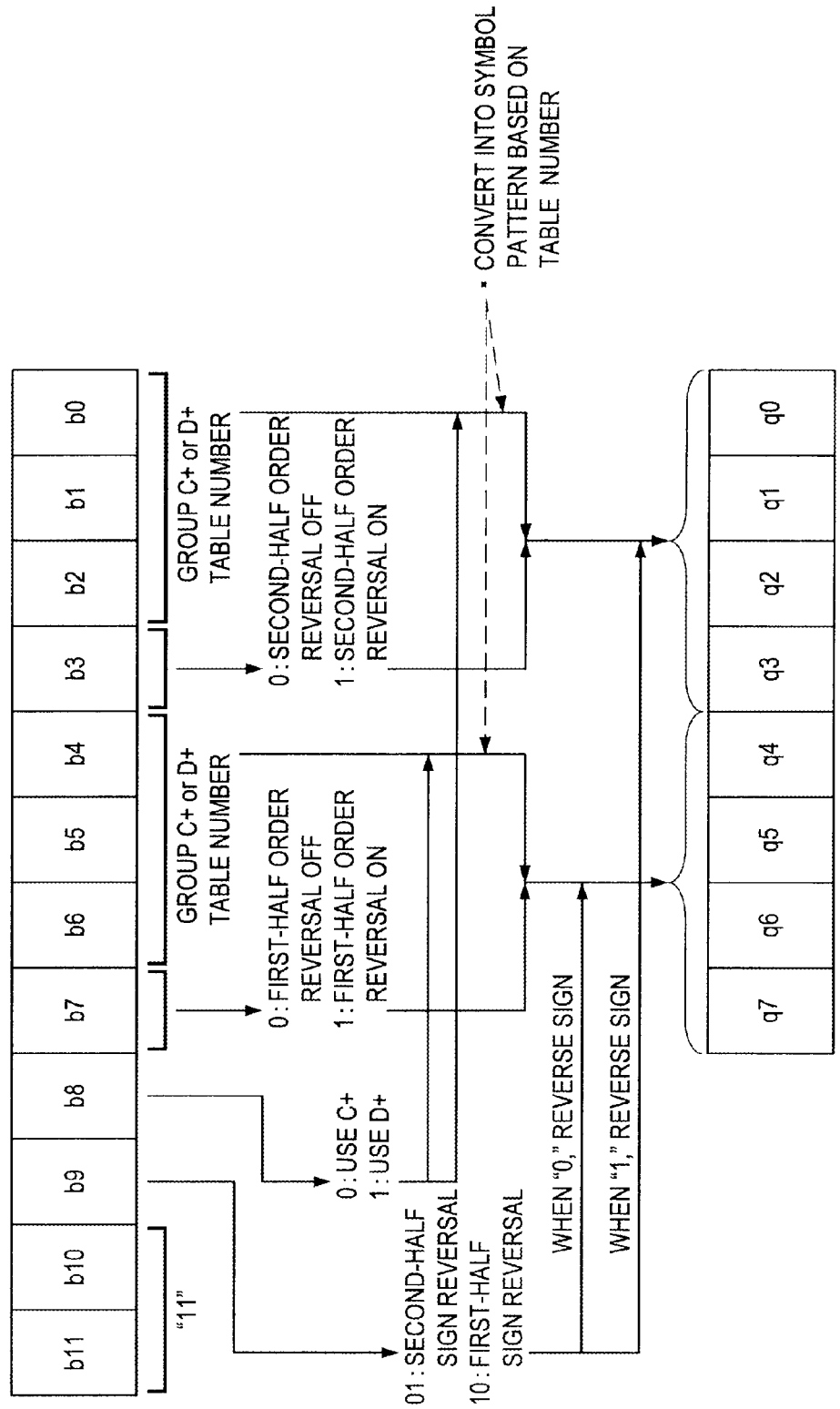

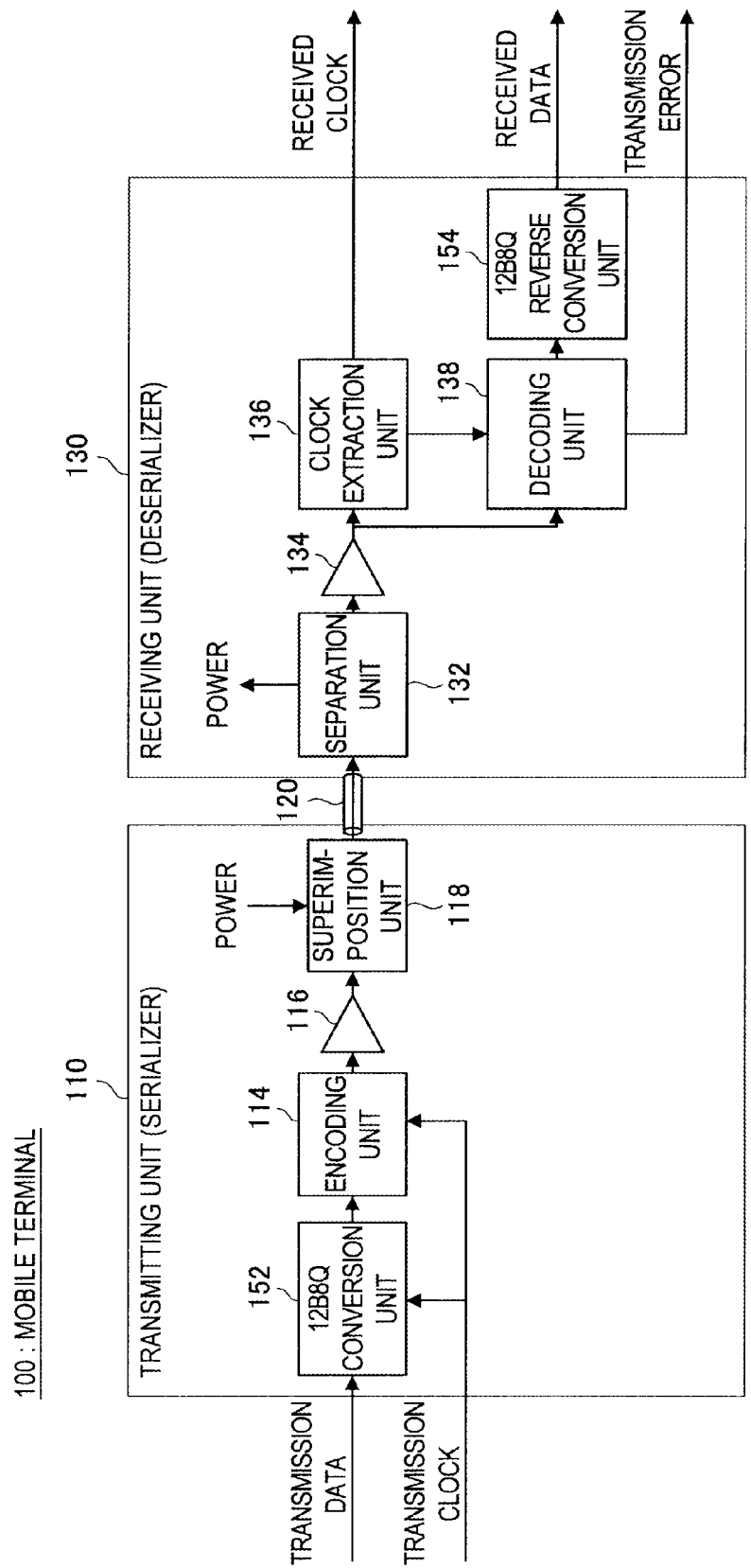

ENCODING APPARATUS, ENCODING METHOD, AND PROGRAM

BACKGROUND OF THE INVENTION

1. Field of the Invention

The present invention relates to an encoding apparatus, an encoding method, and a program.

2. Description of the Related Art

Most information processing apparatuses such as mobile phone and notebook personal computer (hereinafter, a notebook PC) use a movable member for a hinge portion connecting a main body to be operated by a user and a display portion on which information is displayed. However, a large number of signal lines and power lines pass through the hinge portion, and a method for maintaining reliability of the wiring is desired. Reducing the number of the signal lines passing through the hinge portion comes first to mind. Therefore, data transmission processing between the main body and the display portion is made to be performed by a serial transmission method (see FIG. 1) instead of a parallel transmission method. As such, if the serial transmission method is used, the number of signal lines is reduced.

In the serial transmission method, data is encoded and then transmitted. At that time, for example, a Non Return to Zero (NRZ) encoding scheme, a Manchester encoding scheme, an Alternate Mark Inversion (AMI) encoding scheme, or the like is used as the encoding scheme. For example, JP-A-1991-109843 discloses a technology for transmitting data by using an AMI code, which is a representative example of a bipolar code. The patent document also discloses a technology according to which a data clock is transmitted after being expressed by an intermediate value of a signal level, and the receiving side regenerates the data clock based on the signal level.

SUMMARY OF THE INVENTION

However, in an information processing apparatus such as a notebook PC, even if the serial transmission method using the above code is used, the number of signal lines wired in the hinge portion is still large. For example, in a case of a notebook PC, there are wiring lines related to an LED backlight for illuminating an LCD in addition to wiring lines related to video signals to be transmitted to the display portion, and thus several tens of signal lines including these signal lines are wired in the hinge portion. The LCD is an abbreviation for Liquid Crystal Display, and the LED is an abbreviation for Light Emitting Diode.

In view of such issue, an encoding scheme (hereinafter, a new scheme; see FIG. 2) according to which a DC component is not included and according to which a clock component can be easily extracted from a received signal has been developed. Since a transmission signal generated based on this new scheme does not include a DC component, it can be transmitted by being superimposed on a DC power. Furthermore, by detecting a polarity inversion cycle of the transmission signal, a clock can be regenerated by the receiving side without using a PLL. Therefore, a plurality of signal lines can be bound together, and thereby the number of signal lines can be reduced and also the power consumption and the circuit scale can be reduced. The PLL is an abbreviation for Phase Locked Loop.

Now, in recent years, the resolution of the LCD is greatly enhanced as applications are diversified. Accordingly, together with the reduction of power consumption as described above, speeding up of transmission speed is also a large issue. The speeding up of transmission speed can be realized by simply speeding up the clock. However, if the clock is sped up in a serial transmission line, the frequency spectrum of the transmission signal becomes wide, resulting in electromagnetic interference (EMI) to the mobile phone or the like. Also, speeding up of the clock will increase the power consumption.

Therefore, an encoding method that is capable of transmitting more data without increasing a clock frequency is desired. Also, in a case of transmitting the transmission signal by superimposing the same on a DC power as described above, the signal is transmitted through a transmission line having DC cutoff characteristics. Accordingly, an encoding method that is capable of generating a transmission signal with good DC balance is preferable. As an encoding method capable of transmitting more data with the same clock frequency, 8B6T conversion specified by IEEE 802.3u is known, for example. This 8B6T conversion is a conversion method that expresses 8-bit binary (base-2) data by 6 ternary (base-3) symbols. When using 8B6T conversion, the transmission speed can be increased by 4/3=1.33 times without speeding up the clock.

However, a conversion rule of 8B6T conversion is configured from combinations according to which the DC balances of respective sets of 6 symbols are 0 and combinations according to which the DC balances are +1, and may result in most of the DC balances taking a positive value depending on the pattern of the binary data that is the encoding target. As a result, the transmission quality of the transmission signal encoded by 8B6T conversion may greatly deteriorate in a transmission line having DC cutoff characteristics. Furthermore, 8B6T conversion is realized based on a large number of conversion rules that associate binary data patterns and symbol sequences of 6 symbols. These conversion rules are held in a device in the form of a conversion table. In the case of 8B6T conversion, the number of conversion rules is at least 256. When the number of values is further increased in order to increase the transmission speed by a similar method, the number of conversion rules will be increased and the amount of data of the conversion table will be further increased.

In light of the foregoing, it is desirable to provide a new and improved encoding method that uses a smaller conversion table, that maintains a high transmission quality even in a transmission line having DC cutoff characteristics, and that is capable of increasing a transmission speed without widening a frequency spectrum, and an encoding apparatus and a program which are new and improved, and which are capable of realizing the encoding method.

According to an embodiment of the present invention, there is provided an encoding apparatus which includes an encoding unit that converts, based on a first conversion rule group according to which a total value for a base-K symbol sequence is X and a second conversion rule group according to which the total value for the base-K symbol sequence is −X among conversion rule groups for converting an L-bit bit sequence into the base-K symbol sequence (K>2) of N/2 symbol, an M-bit (M≧2*L) bit sequence into the base-K symbol sequence of N symbols. When converting the M-bit bit sequence into the base-K symbol sequence of N symbols, the encoding unit converts a first-half N/2 symbol based on the first conversion rule group and converts a second-half N/2 symbol based on the second conversion rule group.

The encoding unit may store, with respect to a pair of conversion rules, among conversion rules included in the first or second conversion rule group, that will be a same conversion rule when positive/negative reversal is performed on each base-K symbol in the base-K symbol sequence corresponding to the L-bit bit sequence, only one conversion rule and, when conversion is to be performed based on the other conversion rule, uses the one conversion rule by performing positive/negative reversal on each base-K symbol of the one conversion rule.

In a case a second conversion rule that includes a base-K symbol sequence obtained by sequentially reading each base-K symbol from an end of the base-K symbol sequence, of a first conversion rule, corresponding to the L-bit bit sequence exists among conversion rules included in the first or second conversion rule group, the encoding unit may store only the first conversion rule and, when conversion is to be performed based on the second conversion rule, uses the base-K symbol sequence of the first conversion rule by sequentially reading the base-K symbol from the end.

The encoding unit may include a conversion rule storage unit that stores a conversion rule group Rj excluding, from the first or second conversion group according to which the total value for the base-K symbol sequence is Xj (j=1, . . . , J) or −Xj, a conversion rule that can be expressed by positive/negative reversal of the base-K symbol and a conversion rule that can be expressed by reading the base-K symbol sequence in a reverse order, a conversion rule determination unit that expresses the M-bit bit sequence by using two L-bit bit sequences, a specific bit sequence indicating a type j of the conversion rule group Rj used for converting the L-bit bit sequences into base-K symbol sequences of N/2 symbol, a specific bit sequence indicating whether or not positive/negative reversal is to be performed on the base-K symbol sequence of N/2 symbol of each L-bit bit sequence and a specific bit sequence indicating a reading order of the base-K symbol sequence of N/2 symbol of each L-bit bit sequence, and determines a conversion rule for converting the M-bit bit sequence into the base-K symbol sequence of N symbols, and a conversion processing unit that converts the M-bit bit sequence into the base-K symbol sequence of N symbols by using the conversion rule group Rj stored in the conversion rule storage unit, based on the conversion rule determined by the conversion rule determination unit.

The encoding apparatus may further include an arithmetic processing unit that inputs to the encoding unit data relating to display of an image in units of M bits, a data transmitting unit that transmits the base-K symbol sequence obtained by conversion by the encoding unit, a restoration unit that restores the data from the base-K symbol sequence transmitted by the data transmitting unit, and a display unit that displays the image based on the data restored by the restoration unit.

According to another embodiment of the present invention, there is provided an encoding method which includes the step of converting, based on a first conversion rule group according to which a total value for a base-K symbol sequence is X and a second conversion rule group according to which the total value for the base-K symbol sequence is −X among conversion rule groups for converting an L-bit bit sequence into the base-K symbol sequence (K>2) of N/2 symbol, an M-bit (M≧2*L) bit sequence into the base-K symbol sequence of N symbols. When converting the M-bit bit sequence into the base-K symbol sequence of N symbols in the step of converting, a first-half N/2 symbol is converted based on the first conversion rule group and a second-half N/2 symbol is converted based on the second conversion rule group.

According to another embodiment of the present invention, there is provided a program for causing a computer to realize an encoding function of converting, based on a first conversion rule group according to which a total value for a base-K symbol sequence is X and a second conversion rule group according to which the total value for the base-K symbol sequence is −X among conversion rule groups for converting an L-bit bit sequence into the base-K symbol sequence (K>2) of N/2 symbol, an M-bit (M≧2*L) bit sequence into the base-K symbol sequence of N symbols. When converting the M-bit bit sequence into the base-K symbol sequence of N symbols, the encoding function converts a first-half N/2 symbol based on the first conversion rule group and converts a second-half N/2 symbol based on the second conversion rule group.

According to another embodiment of the present invention, there is provided a recording medium in which the program is recorded, the recording medium being able to be read by a computer.

According to the embodiments of the present invention described above, it becomes possible to realize an encoding method that uses a smaller conversion table, that maintains a high transmission quality even in a transmission line having DC cutoff characteristics, and that is capable of increasing a transmission speed without widening a frequency spectrum.

BRIEF DESCRIPTION OF THE DRAWINGS

FIG. 6 is an explanatory diagram for describing the 14B8Q conversion method according to the embodiment;

FIG. 7 is an explanatory diagram for describing the 14B8Q conversion method according to the embodiment;

FIG. 8 is an explanatory diagram for describing the 14B8Q conversion method according to the embodiment;

FIG. 9 is an explanatory diagram for describing the 14B8Q conversion method according to the embodiment;

FIG. 101 is an explanatory diagram for describing the 14B8Q conversion method according to the embodiment;

FIG. 11 is an explanatory diagram for describing the 14B8Q conversion method according to the embodiment;

FIG. 19 is an explanatory diagram for describing the 12B8Q conversion method according to the embodiment;

FIG. 20 is an explanatory diagram for describing the 12B8Q conversion method according to the embodiment;

FIG. 21 is an explanatory diagram for describing the 12B8Q conversion method according to the embodiment;

FIG. 22 is an explanatory diagram for describing the 12B8Q conversion method according to the embodiment;

FIG. 23 is an explanatory diagram for describing the 12B8Q conversion method according to the embodiment;

FIG. 24 is an explanatory diagram for describing the 12B8Q conversion method according to the embodiment;

FIG. 25 is an explanatory diagram for describing the 12B8Q conversion method according to the embodiment;

FIG. 26 is an explanatory diagram for describing the 12B8Q conversion method according to the embodiment;

FIG. 27 is an explanatory diagram for describing the 12B8Q conversion method according to the embodiment;

FIG. 28 is an explanatory diagram for describing the 12B8Q conversion method according to the embodiment;

FIG. 29 is an explanatory diagram for describing the 12B8Q conversion method according to the embodiment; and FIG. 30 is an explanatory diagram showing an example of a functional configuration of a mobile terminal capable of realizing the 12B8Q conversion method according to the embodiment.

DETAILED DESCRIPTION OF THE EMBODIMENT(S)

Figure 1:
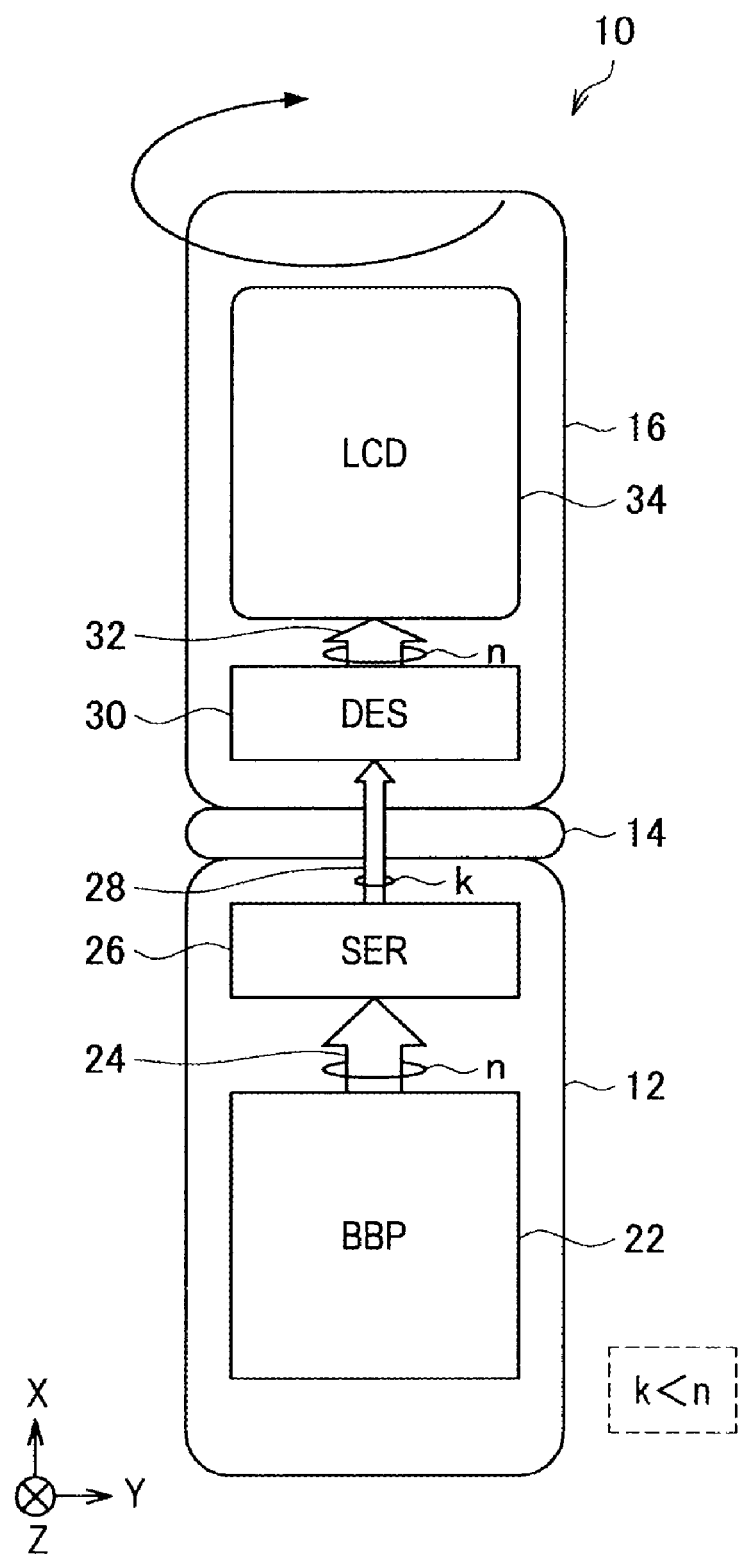
FIG. 1 is an explanatory diagram showing an example of a configuration of a mobile terminal adopting a serial transmission scheme.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

<Flow of Description>

The flow of a description of an embodiment of the present invention described later will be briefly mentioned here. First, a configuration of a mobile terminal 10 adopting a serial transmission scheme will be briefly described with reference to FIG. 1. Then, an encoding method and a decoding method according to the new scheme will be briefly described with reference to FIG. 2.

Next, an encoding method based on 14B8Q conversion according to a first embodiment of the present invention will be described in detail with reference to FIGS. 3 to 14. Then, an example of a functional configuration of a mobile terminal 100 capable of realizing an encoding method according to the embodiment will be described with reference to FIG. 15. Then, an encoding method based on 12B8Q conversion according to a second embodiment of the present invention will be described in detail with reference to FIGS. 16 to 29. Then, an example of a functional configuration of a mobile terminal 100 capable of realizing an encoding method according to the embodiment will be described with reference to FIG. 30. Lastly, the technical idea of the embodiment will be summarized and operational effects obtained by the technical idea will be briefly described.

(Description Items)
1: Introduction
  1-1: Serial Transmission Scheme
  1-2: Encoding Method of New Scheme
2: First Embodiment
  2-1: Encoding Method Based on 14B8Q Conversion
  2-2: Functional Configuration of Mobile Terminal 100

3: Second Embodiment
  3-1: Encoding Method Based on 12B8Q Conversion
  3-2: Functional Configuration of Mobile Terminal 100
4: Summary

1: Introduction

In the following, a detailed explanation will be given on the technology according to an embodiment of the present invention. But before giving the explanation, issues to be solved by the embodiment will be briefly described with reference to concrete examples.

<1-1: Serial Transmission Scheme>

First, a device configuration of a mobile terminal 10 adopting a serial transmission scheme will be briefly described with reference to FIG. 1. FIG. 1 is an explanatory diagram showing an example of a device configuration of the mobile terminal 10 adopting a serial transmission scheme.

In FIG. 1, a mobile phone is schematically illustrated as an example of the mobile terminal 10. However, the application scope of the technology described below is not limited to a mobile phone. For example, it can be applied to an information processing apparatus such as a notebook PC or various portable electronic devices. Also, in the following explanation, a case where image data is transmitted will be described as an example, but the type of a signal to be transmitted is not limited to such. For example, a signal of control data, audio data or the like may also be transmitted.

As shown in FIG. 1, the mobile terminal 10 mainly includes an operation unit 12, a hinge part 14, and a display unit 16. The operation unit 12 includes a baseband processor 22 (BBP), a parallel signal line 24, and a serializer 26. The hinge part 14 includes a serial signal line 28. The display unit 16 mainly includes a deserializer 30, a parallel signal line 32, and a liquid crystal unit 34 (LCD). The LCD is an abbreviation for Liquid Crystal Display.

The liquid crystal unit 34 is provided on the display unit 16. The liquid crystal unit 34 is an example of display means for displaying image data. The LCD is indicated as an example here, but the type of the display means provided on the display unit 16 is not limited to such. For example, the display means provided on the display unit 16 may be an OELD (Organic Electroluminescent Display), a PDP (Plasma Display Panel), or the like.

Furthermore, the hinge part 14 is formed from a member (hereinafter, connecting member) connecting the display unit 16 and the operation unit 12. This connecting member has a movable structure that allows the display unit 16 to rotate 180 degrees in Z-Y plane, or to rotate in an X-Z plane, for example. Furthermore, this connecting member may also have a movable structure that allows the display unit 16 to be arranged in any direction.

Furthermore, the baseband processor 22 is an example of an arithmetic processing unit that provides the mobile terminal 10 with a communication control function and an application execution function. The baseband processor 22 outputs control data, image data and the like in the form of a parallel signal. For example, a parallel signal of image data is transmitted to the display unit 16, and is used for image display on the liquid crystal unit 34. When such parallel signal is to be transmitted as it is, a large number of signal lines will be necessary. For example, the number of parallel signal lines used for image display by a general mobile phone is about fifty.

In a case of a folding mobile phone adopting a general parallel transmission scheme, approximately fifty parallel signal lines are wired in the hinge portion. Accordingly, the movable range of the hinge portion is, in many cases, limited to one direction. If rotation of 180 degrees in a Z-Y plane is allowed as with the mobile terminal 10 shown in FIG. 1, a twisting force or a pulling force is applied on the approximately fifty parallel signal lines in the hinge portion, and if the force is strong, the parallel signal lines will break. Accordingly, in the case of the folding mobile phone adopting a general parallel transmission scheme, the movable range of the hinge portion is limited.

However, a modification for enlarging the movable range of the hinge portion while avoiding the risk of breaking of lines is desired in order to improve the design and the convenience of a user. In view of such issue, the mobile terminal 10 of a serial transmission scheme as shown in FIG. 1 has been devised. The mobile terminal 10 converts a parallel signal into a serial signal and transmits the same. Accordingly, it has a characteristic that the number of signal lines in the hinge part 14 is significantly less than a mobile phone of the parallel transmission scheme. In the following, a configuration of the mobile terminal 10 will be described in greater detail.

The mobile terminal 10 transmits data, such as image data, based on the serial transmission scheme, through the serial signal line 28 in the hinge part 14. Therefore, the serializer 26 is provided in the operation unit 12. The serializer 26 is for serializing a parallel signal output from the baseband processor 22. On the other hand, the deserializer 30 is provided in the display unit 16. The deserializer 30 is for parallelizing a serial signal transmitted through the serial signal line 28.

A parallel signal output from the baseband processor 22 is input to the serializer 26 via the parallel signal line 24. When the parallel signal is input, the serializer 26 serializes the input parallel signal, and generates a serial signal. The serial signal generated by the serializer 26 is input to the deserializer 30 via the serial signal line 28. When the serial signal is input, the deserializer 30 parallelizes the input serial signal, and generates a parallel signal. The parallel signal generated by the deserializer 30 is input to the liquid crystal unit 34 via the parallel signal line 32.

As described above, the serial signal line 28 is used for transmission of a data signal. Furthermore, the serial signal line 28 may also be used for transmitting together a data signal and a clock. The number k of lines of the serial signal line 28 is significantly less than the number n of lines of the parallel signal line in the hinge portion of a general mobile phone ($1 \leq k \ll n$). Furthermore, the number k of lines of the serial signal line 28 is reduced to approximately one in a case a scheme of superimposing the data signal and the clock on a power line and transmitting the same (for example, the new scheme described above) is used.

As described, when adopting the serial transmission scheme, the number of signal lines in the hinge part 14 can be greatly reduced compared to the case of adopting the parallel transmission scheme used by a general mobile phone. With the number of signal lines in the hinge part 14 being reduced, the movable range of the hinge part 14 can be enlarged while maintaining the reliability of the signal line. For example, when the number of signal lines is reduced to approximately one, the signal line is less likely to be, for example, twisted or pulled at the time the hinge part 14 is transformed, and the risk of the signal line breaking is greatly reduced.

Heretofore, a device configuration of the mobile terminal 10 has been briefly described. The configuration of the mobile terminal 10 adopting the serial transmission scheme is basically as described above. As described above, the number of signal lines in the hinge part 14 can be reduced by adopting the serial transmission scheme. However, the number of signal lines depends on the characteristics of a signal passing through the serial signal line 28 and the transmission method. For example, in the case of a transmission scheme of superimposing a data signal not including a DC component on a power line and transmitting the same, a data line and the power line can be bound together to one line.

<1-2: Encoding Method of New Scheme>

Figure 2:
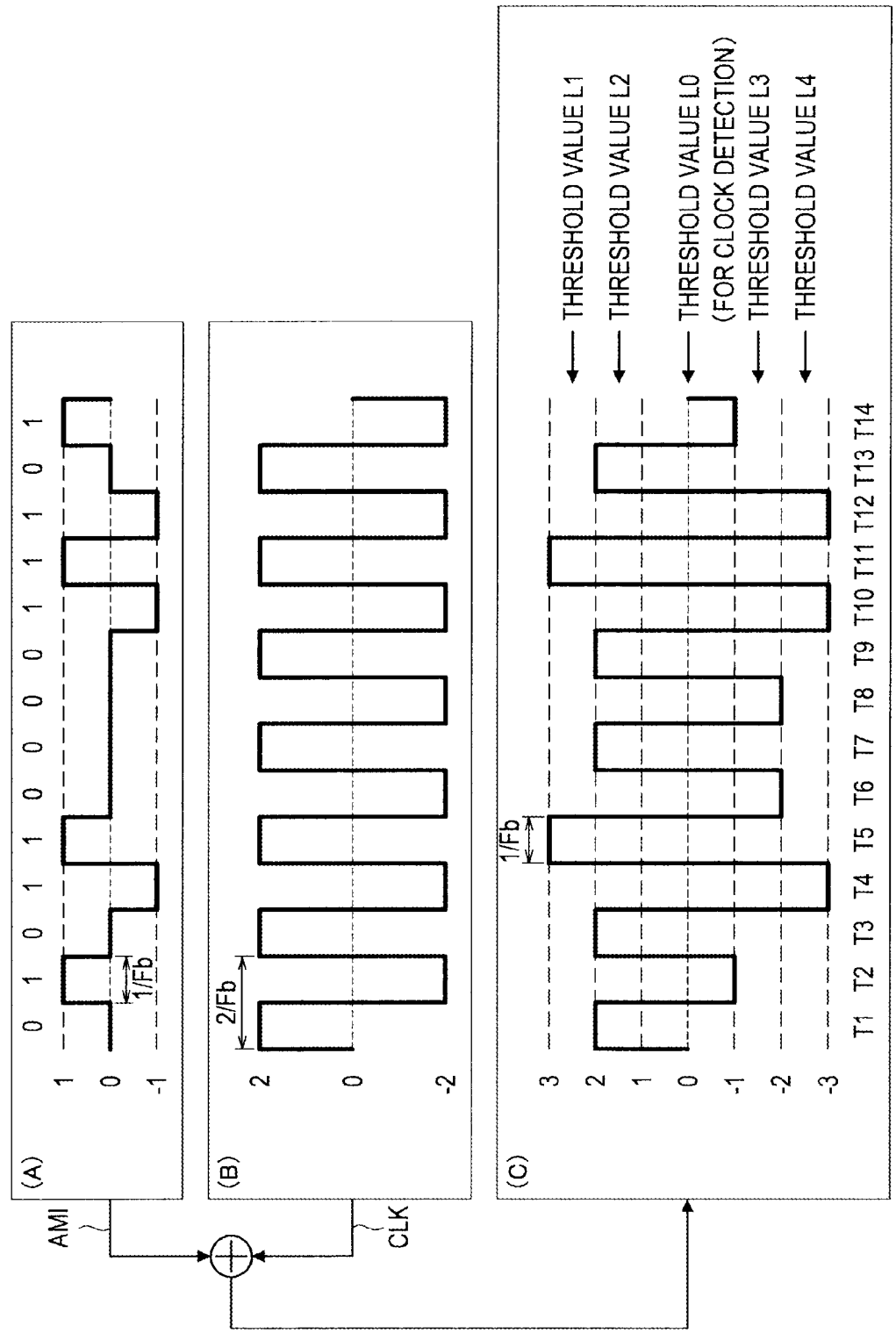
FIG. 2 is an explanatory diagram showing an example of a transmission signal (multilevel code) generation method and an amplitude determination method according to a new scheme.

Here, an encoding method according to the new scheme will be briefly described with reference to FIG. 2. FIG. 2 is an explanatory diagram showing an encoding method according to the new scheme. Additionally, the technology of each embodiment described later does not necessarily have to be used in combination with the encoding method of the new scheme. However, when combined with the encoding method of the new scheme, additional effects can be obtained. For example, it becomes unnecessary to provide a PLL on the receiving side, and the power consumption and the circuit scale can be reduced to that extent.

(Overview)

The encoding method of the new scheme is for generating a transmission signal by generating a symbol sequence not including a DC component by encoding data, generating a data signal having, as an amplitude value, a value of each symbol included in the generated symbol sequence, and synchronously adding, to the data signal, a clock having an amplitude larger than the generated data signal.

As an encoding scheme capable of generating the symbol sequence not including a DC component, there are the AMI encoding scheme, a partial response encoding scheme, the Manchester encoding scheme, a CMI encoding scheme, and the like, for example. Of course, in addition to these encoding schemes, various types of bipolar encoding schemes, biphase encoding schemes, dicode encoding schemes and the like can be applied as the encoding method of the new scheme. The CMI is an abbreviation for Coded Mark Inversion. Furthermore, as a Manchester code, PR(1, −1), PR(1, 0, −1), PR(1, 0, . . . , −1), and the like can be used, for example.

(AMI Code)

Here, an encoding method of the new scheme for which the AMI encoding scheme serves as a base will be described. First, a signal waveform of an AMI code and characteristics of the AMI code will be briefly described with reference to (A) of FIG. 2. A signal waveform of a data signal encoded based on the AMI encoding scheme (an AMI code with a duty of 100%) is shown in (A) of FIG. 2. Moreover, the numbers 0 and 1 shown above the signal waveform shown in (A) of FIG. 2 indicate data before encoding.

A signal waveform of the AMI code can be obtained by expressing a data value of zero with an electrical potential of zero and expressing a data value of one with potentials of A and −A (A is any positive number; in the example of (A) of FIG. 2, A=1). Note, however, that after a data value of 1 has been expressed by the potential A, if the next data bit is also a 1, that data bit 1 will be expressed by the potential −A. That is, the potential A and the potential −A are used alternately. Since the potentials A and −A are repeated alternately, a data signal of data which has been encoded into the AMI code has a signal waveform that hardly contains DC components. Additionally, in the following explanation, the reversal of positive and negative is sometimes referred to as polarity inversion. For example, a change in the potential from the potential A to the potential −A is sometimes referred to as polarity inversion of potential.

As described above, a data signal generated based on the AMI encoding scheme is a code that hardly contains DC components. However, depending on a combination of data bits, a potential of zero may occur consecutively as in the section T6, . . . , T9 of the data signal illustrated in (A) of FIG.

2. When, as described above, a section where a potential of zero occurs consecutively is included, it becomes difficult to regenerate a clock by detecting positions of edges included in the signal waveform of the data signal. Accordingly, it becomes necessary to use a PLL to regenerate the clock.

However, providing a PLL causes the circuit scale or the power consumption to increase. Accordingly, to avoid such increase in the circuit scale or the power consumption, an encoding method (encoding method of the new scheme) that allows the clock to be regenerated from a data signal without the use of a PLL has been devised.

(Details; Encoding Method)

According to the encoding method of the new scheme, first, a data signal that does not include a DC component is generated. In the example of FIG. 2, a data signal ((A) of FIG. 2) based on an AMI code is generated. Next, a clock ((B) of FIG. 2) having an amplitude larger than the data signal is generated. In the example of FIG. 2, the amplitude of the clock is set to be twice the data signal. Then, the data signal and the clock that have been generated are synchronously added, and a transmission signal ((C) of FIG. 2) is generated. The transmission signal generated in this manner is a multilevel signal expressing one bit value in a plurality of amplitude levels. In the example of FIG. 2, a data value 0 is expressed by amplitude values 2 and −2 of the transmission signal, and a data value 1 is expressed by amplitude values 3, 1, −1 and −3 of the transmission signal.

As shown in (C) of FIG. 2, the amplitude value of the transmission signal described above inevitably crosses the line of amplitude value 0 (zero crossing) every half cycle of the clock. For example, even in the section T6 to T9 where the amplitude value of the data signal is consecutively 0, the amplitude value of the transmission signal described above does not take the same value consecutively. Accordingly, by detecting a timing of the amplitude value of the transmission signal described above crossing zero, the clock can be regenerated based on the detection result without using a PLL.

(Details; Decoding Method)

When decoding, at the receiving side, original data from the transmission signal described above, first, a clock component is extracted from the transmission signal. As described above, this transmission signal has a characteristic of crossing zero every half cycle of the clock. Accordingly, a process of detecting the timing of the amplitude value of the transmission signal crossing zero and regenerating the clock based on the detection result is performed at the receiving side. The timing of the amplitude value of the transmission signal crossing zero is detected based on a result of performing threshold determination on the amplitude value of the transmission signal by using threshold value L0 shown in (C) of FIG. 2. For example, by capturing the timing the result of threshold determination using the threshold value L0 changed, the timing of the amplitude value of the transmission signal crossing zero can be detected.

When the clock is regenerated, the amplitude value of the transmission signal is determined synchronously with a rising or falling edge of the regenerated clock. As described above, this transmission signal is a multilevel signal. Therefore, a plurality of threshold values becomes necessary to determine the amplitude values of the transmission signal. In the example of FIG. 2, threshold values L1 to L4 are set for determining six values, 3, 2, 1, −1, −2 and −3. For example, the threshold values L1 to L4 are set as L1=2.5, L2=1.5, L3=−1.5 and L4=−2.5. By performing threshold determination by using these four threshold values, L1 to L4, an amplitude value A1 (−1, −3, 1, 3) indicating a data value 1 and an amplitude value A2 (−2, 2) indicating a data value 0 can be respectively detected. Then, the original data is restored from the detection results for the amplitude values A1 and A2 based on the threshold values L1 to L4.

As described, by using an encoding method according to which a DC component is not included and according to which a clock component can be detected from a polarity inversion cycle, a PLL does not have to be used for the process of detecting a clock performed at the receiving side. As a result, a PLLL does not have to be provided, and the circuit scale and the power consumption can be reduced to that extent. Furthermore, when using the encoding method illustrated in FIG. 2, a transmission signal that does not contain a DC component is obtained, and thus the transmission signal can be transmitted, being superimposed on a power line. In this case, data, a clock and power can be transmitted by one power line.

Heretofore, the encoding method according to the new scheme has been described. As described above, by using the encoding method according to the new scheme, the circuit scale and the amount of power consumption can be reduced. Furthermore, by superimposing the transmission signal on the power line and transmitting the same, the number of lines in the hinge part 14 can be reduced. However, the transmission signal described above is a multilevel signal that expresses one bit value by a plurality of amplitude values, and is redundant compared to an NRZ signal or the like that expresses one bit value by one amplitude value. Furthermore, in the case of the encoding method according to the new scheme, the increase in the redundancy will not increase a transmission speed.

As a method of increasing the transmission speed, there can be conceived a method of speeding up the clock, for example. However, if the clock is sped up, the frequency spectrum of the transmission signal passing through the serial signal line 28 widens and EMI increases. Furthermore, if the clock is sped up, the power consumption increases. For these reasons, there was a limit to the speeding up of the clock. For these reasons, a method of transmitting data at a high speed by making use of the redundancy of the transmission signal and without increasing the influence of EMI or the consumption power is being considered.

(8B6T Conversion)

As a method of realizing high-speed data transmission by using the redundancy of the transmission signal, a data transmission method that uses 8B6T conversion specified by IEEE 802.3u is known, for example. The 8B6T conversion is an encoding method of converting an 8-bit bit sequence into a ternary symbol sequence of 6 symbols. The ternary symbol sequence is transmitted in the form of a ternary signal having the value of each symbol as an amplitude value. When using 8B6T conversion, the transmission speed can be increased by 8/6=1.33 times without speeding up the clock. However, a conversion rule of 8B6T conversion includes combinations whose DC balances of respective sets of 6 symbols (total values of respective 6 symbols) are 0 and combinations whose DC balances are +1. Therefore, depending on the pattern of binary data, a larger proportion of the DC balances may take positive values. When a larger proportion of the DC balances takes positive values, a transmission quality of a transmission line having DC cutoff characteristics greatly deteriorates. For this reason, a technology for increasing the transmission speed while avoiding deterioration of the transmission quality of a transmission line having DC cutoff characteristics and avoiding the widening of the frequency spectrum is desired.

Furthermore, the number of conversion rules of 8B6T conversion is extremely large. For example, if the conversion rules to be used for 8B6T conversion are to be held in the form of a conversion table, the amount of data of the conversion table will be extremely large. Accordingly, when the conversion table is to be internally held by the mobile terminal 10, the circuit scale of the mobile terminal 10 will increase. Also, when the number of values is further increased in order to increase the transmission speed by a method similar to 8B6T conversion, the number of conversion rules will increase and the amount of data of the conversion table will further increase. Accordingly, the inventor of the present invention has devised a method of further increasing the transmission speed while using a relatively small conversion table, avoiding the widening of the frequency spectrum and avoiding deterioration of the transmission quality of a transmission line having DC cutoff characteristics. In the following, an embodiment according to the method will be described in detail.

2: First Embodiment

First, the first embodiment of the present invention will be described. The present embodiment relates to 14B8Q (14 Binary 8 Quinary) conversion of converting a 14-bit bit sequence into a quinary (base-5) symbol sequence of 8 symbols.

<2-1: Encoding Method Based on 14B8Q Conversion>

In the following, an encoding method based on 14B8Q conversion will be described in detail.

(14B8Q Conversion)

Figure 3:
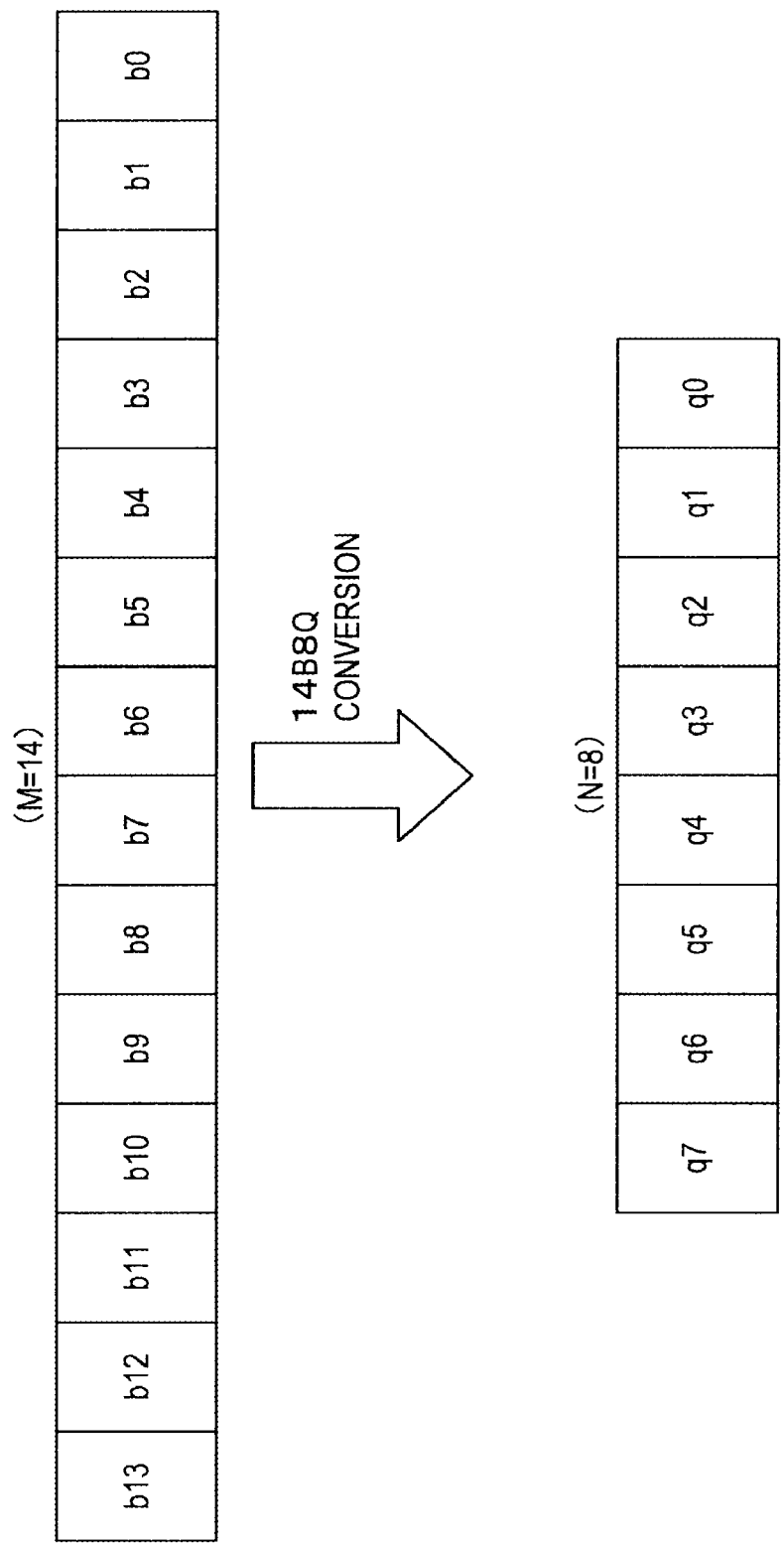
FIG. 3 is an explanatory diagram showing a 14B8Q conversion method according to a first embodiment of the present invention.
Figure 4:
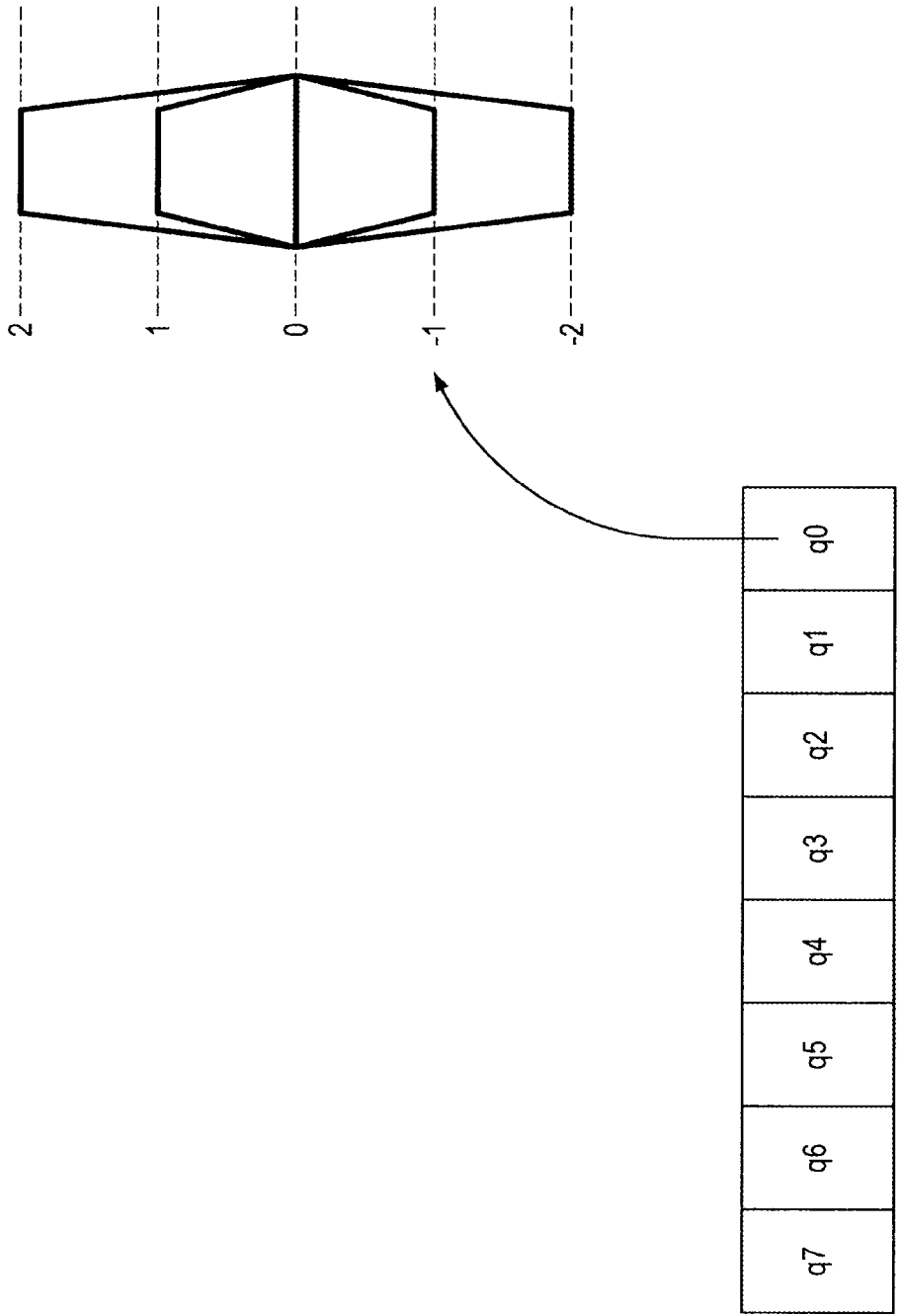
FIG. 4 is an explanatory diagram for describing the 14B8Q conversion method according to the embodiment.

First, 14B8Q conversion and a data transmission method based on 14B8Q conversion will be described with reference to FIGS. 3 and 4. As shown in FIG. 3, 14B8Q conversion is a method of converting a 14-bit bit sequence $\{b0, \ldots, b13\}$ into a quinary symbol sequence of 8 symbols $\{q0, \ldots, q7\}$. Additionally, as shown in FIG. 4, the (j+1)-th symbol qj (j=0 to 7) included in the quinary symbol sequence takes a quinary symbol value (for example, +2, +1, 0, −1, −2). The quinary symbol sequence generated by 14B8Q conversion is transmitted in the form of a transmission signal having the symbol value of each symbol as an amplitude. An eye pattern of this transmission signal will roughly take the form as shown on the right side in FIG. 4.

Here, consideration will be given to a combination of M and N that allows realization of MBNQ conversion (M and N are natural numbers; M>N). The MBNQ conversion assumed here is a method of converting M-bit bit sequences $\{b0, \ldots, b(M-1)\}$ into a quinary symbol sequence of N symbols $\{q0, \ldots, q(N-1)\}$. Of course, when the number of combinations expressed by the quinary symbol sequence of N symbols $\{q0, \ldots, q(N-1)\}$ is less than the number of combinations expressed by the M-bit bit sequences $\{b0, \ldots, b(M-1)\}$, it is not possible to realize MBNQ conversion. The number of combinations for the M-bit bit sequence $\{b0, \ldots, b(M-1)\}$ is $2^M$. Also, the number of combinations for the quinary symbol sequence of N symbols $\{q0, \ldots, q(N-1)\}$ is $5^N$. Accordingly, to realize MBNQ conversion, the condition $2^M < 5^N$ has to be satisfied.

Furthermore, in the case of M≦N, the transmission speed is M/N≦1 when compared to the case where the M-bit bit sequence is transmitted as it is, and thus the transmission speed is not increased even if MBNQ conversion is used. Accordingly, to realize effective MBNQ conversion, it is necessary to determine M and N that satisfy condition 1: $2^M < 5^N$ and condition 2: M>N. For example, 14B8Q conversion corresponds to a case where M=14 and N=8. Since $2^{14} = 16,384$ and $5^8 = 390,625$, condition 1 is satisfied. Also, since M (=14)>N (=8), condition 2 is satisfied. Additionally, since $2^{18} = 262,144$, conditions 1 and 2 are satisfied also in the case where M=18. When using 14B8Q conversion, the transmission speed is increased by 14/8=1.75 times. Also, when using 18B8Q conversion, the transmission speed is increased by 18/8=2.25 times.

By selecting M and N so as to satisfy the above-described conditions 1 and 2, a combination of M and N capable of realizing MBNQ conversion can be determined. Also, by selecting a combination of M and N according to which M/N is large, the transmission speed can be increased. However, combinations for quinary symbol sequence $\{q0, \ldots, q(N-1)\}$ include a large number of combinations whose DC values are not 0. If a combination in quinary symbol sequence whose DC value is not 0 is used, a DC component will be included in the transmission signal and the signal quality will deteriorate in a DC cutoff transmission line. Therefore, it is desirable to define the conversion rule of MBNQ conversion by selecting a combination whose DC value is 0 among combinations for quinary symbol sequence $\{q0, \ldots, q(N-1)\}$.

Figure 5:
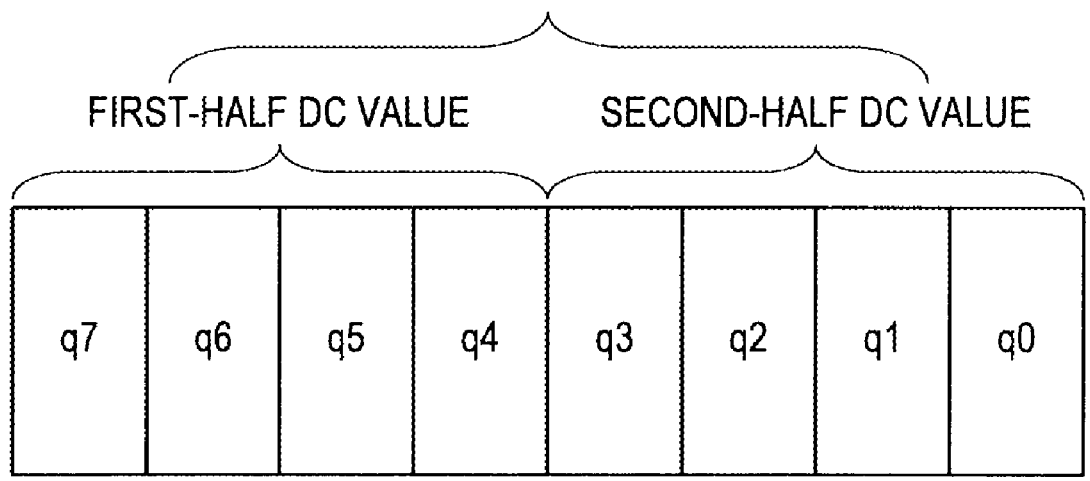
FIG. 5 is an explanatory diagram for describing the 14B8Q conversion method according to the embodiment.

However, the number of combinations for quinary symbol sequence whose DC values are 0 is not so large. If condition 1 is changed to "$2^M$<the number of combinations for quinary symbol sequence whose DC values are 0," only the combinations of M and N for which M/N is small will be obtained. Accordingly, to greatly increase the transmission speed, a method of suppressing the DC component in a transmission signal while using a combination in quinary symbol sequence whose DC value is other than 0 is desired. In view of such issue, the inventor of the present invention has devised, as shown in FIG. 5, an encoding method of dividing a quinary symbol sequence of 8 symbols into first-half 4 symbols and second-half 4 symbols and making the DC value of the whole quinary symbol sequence of 8 symbols a 0.

In the case of the quinary symbol sequence $\{q0, \ldots, q7\}$ illustrated in FIG. 4, the symbol value qj of each symbol takes a quinary value of −2, −1, 0, +1 or +2, and thus the DC value of the quinary symbol sequence $\{q0, \ldots, q7\}$ will be up to 16 (=2*8). The encoding method of the present embodiment is a method of encoding a 14-bit bit sequence $\{b0, \ldots, b13\}$ such that the DC value of the first-half 4 symbols will be X (X is a real number) and the DC value of the second-half 4 symbols will be −X. As described, with the DC value of the first-half 4 symbols and the DC value of the second-half 4 symbols taking the same absolute value with one being positive and the other being negative, the DC value of the whole quinary symbol sequence of 8 symbols will be 0.

Here, referring to FIG. 6, consideration will be given to a relationship between the number of possible combinations for a quinary symbol sequence of 4 symbols and a DC value. The number of possible combinations for the quinary symbol sequence of 4 symbols is 625. Among these, there are 85 types of combinations whose DC values are 0, as shown in FIG. 6. Also, there are 80 types of combinations whose DC values are +1, and 80 types of combinations whose DC values are −1. The number of combinations whose DC values are +2, +3, ..., +8 and the number of combinations whose DC values are −2, −3, ..., −8 are as shown in FIG. 6. In the case of the quinary symbol sequence of 4 symbols, each symbol will take a value between −2 and +2, and thus the DC value of the quinary symbol sequence will be limited to integers between −8 and +8.

Now, to realize 14B8Q conversion, $2^{14}$ types of quinary symbol sequences have to be generated by combining first-half 4 symbols and second-half 4 symbols. However, referring to FIG. 6, there are only 85 types of combinations whose DC values are 0. Thus, only $85^2 = 7225$ types of quinary symbol sequences can be obtained when combining first-half 4 symbols whose DC value is 0 and second-half 4 symbols whose DC value is 0. However, when combining first-half 4 symbols whose DC value is +1 and second-half 4 symbols whose DC value is −1, $80^2=6400$ types of quinary symbol sequences can be obtained. Similarly, when combining first-half 4 symbols whose DC value is −1 and second-half 4 symbols whose DC value is +1, $80^2=6400$ types of quinary symbol sequences can be obtained.

The number of combinations of first-half 4 symbols with a DC value X and second-half 4 symbols with a DC value −X is as shown in FIG. 7. Note that X is between +8 and −8. The total of the numbers of combinations is 38,165. That is, by using quinary symbol sequences of 4 symbols whose DC values are not 0, more than $2^{14}$ types of quinary symbol sequences of 8 symbols can be obtained. Also, since the DC value of the first-half 4 symbols is X and the DC value of the second-half 4 symbols is −X, the DC value of the quinary symbol sequence of 8 symbols will be 0. Additionally, since $38,165 > 2^{15}$, this method can also be applied to 15B8Q conversion. However, to obtain a transmission signal with better characteristics, it is preferable not to use a quinary symbol sequence of 4 symbols the absolute value of whose DC value is large.

Accordingly, in the encoding method of the present embodiment, combinations of 4 symbols the absolute values of whose DC values are 3 or less will be used in consideration of influence of a DC value change over a short period of time (a 4-symbol period). As described above, under the condition of M=14, there are 16,384 types of combinations for 14-bit bit sequence. Accordingly, at the time of performing 14B8Q conversion or 14B8Q reverse conversion, 16,384 types of conversion rules are referred to. In reality, a conversion table in which 16,384 types of conversion rules are recorded in advance is referred to at the time of performing 14B8Q conversion. However, the amount of data of the conversion table in which 16,384 types of conversion rules are recorded is large. Thus, the circuit scale is increased. Accordingly, the inventor of the present invention has devised a method of reducing the number of conversion rules to be recorded and held in the conversion table.

(Method of Reducing Conversion Table)

First, quinary symbol sequences of 4 symbols are grouped for each DC value. For example, a group of DC value=0 is expressed as group A, a group of DC value=+1 as group B+, and a group of DC value=−1 as group B−. Also, a group of DC value=+2 is expressed as group C+, a group of DC value=−2 as group C−, a group of DC value=+3 as group D+, and a group of DC value=−3 as group C−.

(Sign Reversal)

As shown in FIG. 6, there are 85 types of combinations of 4 symbols (hereinafter, symbol pattern) belonging to group A (DC value=0). Among these, 84 types of symbol patterns excluding {0, 0, 0, 0} are configured from 42 types of certain symbol patterns and 42 types of combinations obtained by reversing the sign (reversing the positive and negative) of each symbol value in the certain symbol patterns. That is, a combination obtained by reversing the sign of each symbol value in a certain symbol pattern is inevitably included in the above-described 84 types of symbol patterns. For example, a symbol pattern {2, 1, −1, −2} belongs to group A. And group A also includes a symbol pattern {−2, −1, 1, 2} obtained by reversing the signs of the above symbol pattern.

As described above, group A includes 42 types of symbol patterns that can be expressed by sign reversal as described. Therefore, symbol patterns belonging to group A can be expressed by using 42 types of symbol patterns. Accordingly, at the time of 14B8Q conversion, symbol patterns belonging to group A can be obtained by using 42 types of conversion rules. As a result, the number of conversion rules to be recorded in a conversion table is reduced to half. As such, by using sign reversal, the size of a conversion table can be reduced to half.

Furthermore, symbol patterns belonging to group B− can be obtained by reversing the signs of the symbol patterns belonging to group B+. Also, symbol patterns belonging to group C− can be obtained by reversing the signs of the symbol patterns belonging to group C+. Also, symbol patterns belonging to group D− can be obtained by reversing the signs of the symbol patterns belonging to group D+.

Therefore, the symbol patterns belonging to groups B+ and B− (hereinafter, group B) can be expressed by 80 types of symbol patterns belonging to group B+ or B−. Also, the symbol patterns belonging to groups C+ and C− (hereinafter, group C) can be expressed by 68 types of symbol patterns belonging to group C+ or C−. Furthermore, the symbol patterns belonging to groups D+ and D− (hereinafter, group D) can be expressed by 52 types of symbol patterns belonging to group D+ or D−.

Accordingly, at the time of 14B8Q conversion, symbol patterns belonging to groups B, C and D can be obtained by using 80 types, 68 types and 52 types of conversion rules, respectively. As a result, the number of conversion rules to be recorded in a conversion table is reduced to half. As described, by using sign reversal, the size of a conversion table can be reduced to half.

(Order Reversal)

As described above, the size of a conversion table can be reduced to half by using sign reversal. However, the number of conversion rules to be referred to at the time of 14B8Q conversion is as large as 42+80+68+52=242.

Accordingly, the inventor of the present invention has took notice that the 80 types of symbol patterns belonging to group B+ are configured from certain 40 types of symbol patterns and 40 types of symbol patterns obtained by reversing the arranged order (hereinafter, order reversal) of the symbols included in the above certain symbol patterns. For example, a symbol pattern {−2, 0, 1, 2} and a symbol pattern {2, 1, 0, −2} obtained by reversing the order of the above symbol pattern are included in group B+.

As such, there are 40 types of sets of symbol patterns in group B+ that can be expressed by order reversal. Thus, the symbol patterns belonging to group B+ can be expressed by 40 types of symbol patterns. Accordingly, at the time of 14B8Q conversion, the symbol patterns belonging to group B can be obtained by using 40 types of conversion rules. Similarly, in group D+, there are 26 types of sets of symbol patterns that can be expressed by order reversal.

Accordingly, the symbol patterns belonging to group D can be obtained by using 26 types of conversion rules. As a result, with regard to groups B and D, the number of conversion rules to be recorded in the conversion table is reduced to half. Group C+ also includes sets of symmetrical symbol patterns, and thus the number of conversion rules can be reduced by using order reversal. As such, by using order reversal, the size of the conversion table can be reduced.

(Example of Conversion Table)

As has been described, 14 bits can be expressed without using all of the $5^{14}$ symbol patterns. Therefore, the number of conversion rules to be recorded in a conversion table can be reduced by selectively using only the necessary number of symbol patterns to be used for 14B8Q conversion. For example, as the symbol patterns to be used, 32 types are selected from group A (see FIG. 8), 32 types from group B (see FIG. 9), 16 types from group C (see FIG. 10), and 16 types from group D (see FIG. 11). Additionally, the symbol patterns that are not used for 14B8Q conversion can be used as a symbol pattern for synchronization and the like.

Here, FIG. 8 is a conversion table (hereinafter, table A) for converting a specific bit sequence (hereinafter, group A table number) into a symbol pattern belonging to group A. For example, a conversion rule for converting group A table No. {00001} into symbol pattern {−2, −1, 2, 1} is recorded in table A. Also, FIG. 9 is a conversion table (hereinafter, table B) for converting a specific bit sequence (hereinafter, group B table number) into a symbol pattern belonging to group B. For example, a conversion rule for converting group B table No. {00001} into symbol pattern {−2, 0, 2, 1} is recorded in table B.

FIG. 10 is a conversion table (hereinafter, table C) for converting a specific bit sequence (hereinafter, group C table number) into a symbol pattern belonging to group C. For example, a conversion rule for converting group C table No. {00001} into symbol pattern {−1, 0, 2, 1} is recorded in table C. Also, FIG. 11 is a conversion table (hereinafter, table D) for converting a specific bit sequence (hereinafter, group D table number) into a symbol pattern belonging to group D. For example, a conversion rule for converting group D table No. {10001} into symbol pattern {−2, 2, 2, 1} is recorded in table D.

(Concrete Encoding Method)

Figure 12:
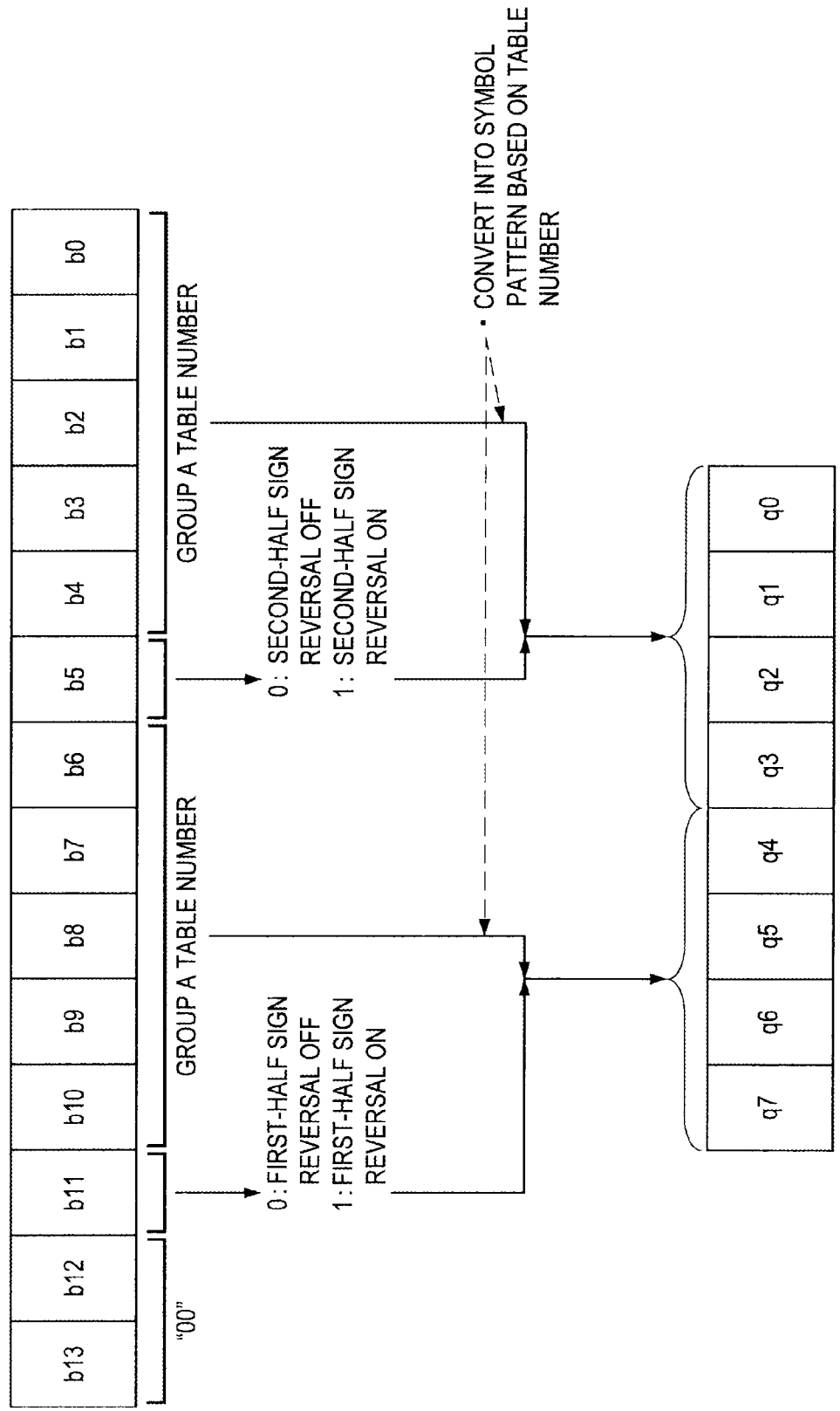
FIG. 12 is an explanatory diagram for describing the 14B8Q conversion method according to the embodiment.
Figure 13:
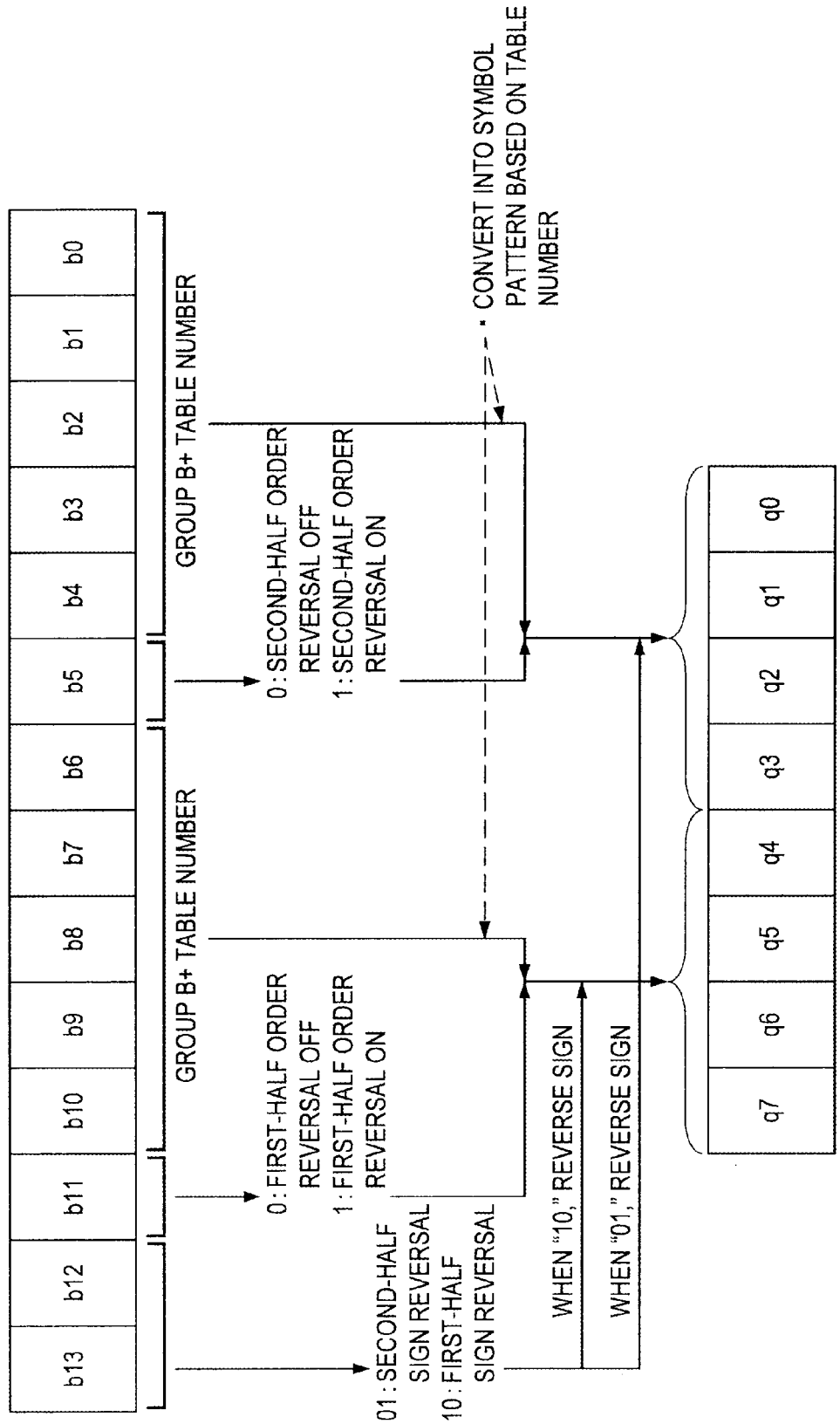
FIG. 13 is an explanatory diagram for describing the 14B8Q conversion method according to the embodiment.
Figure 14:
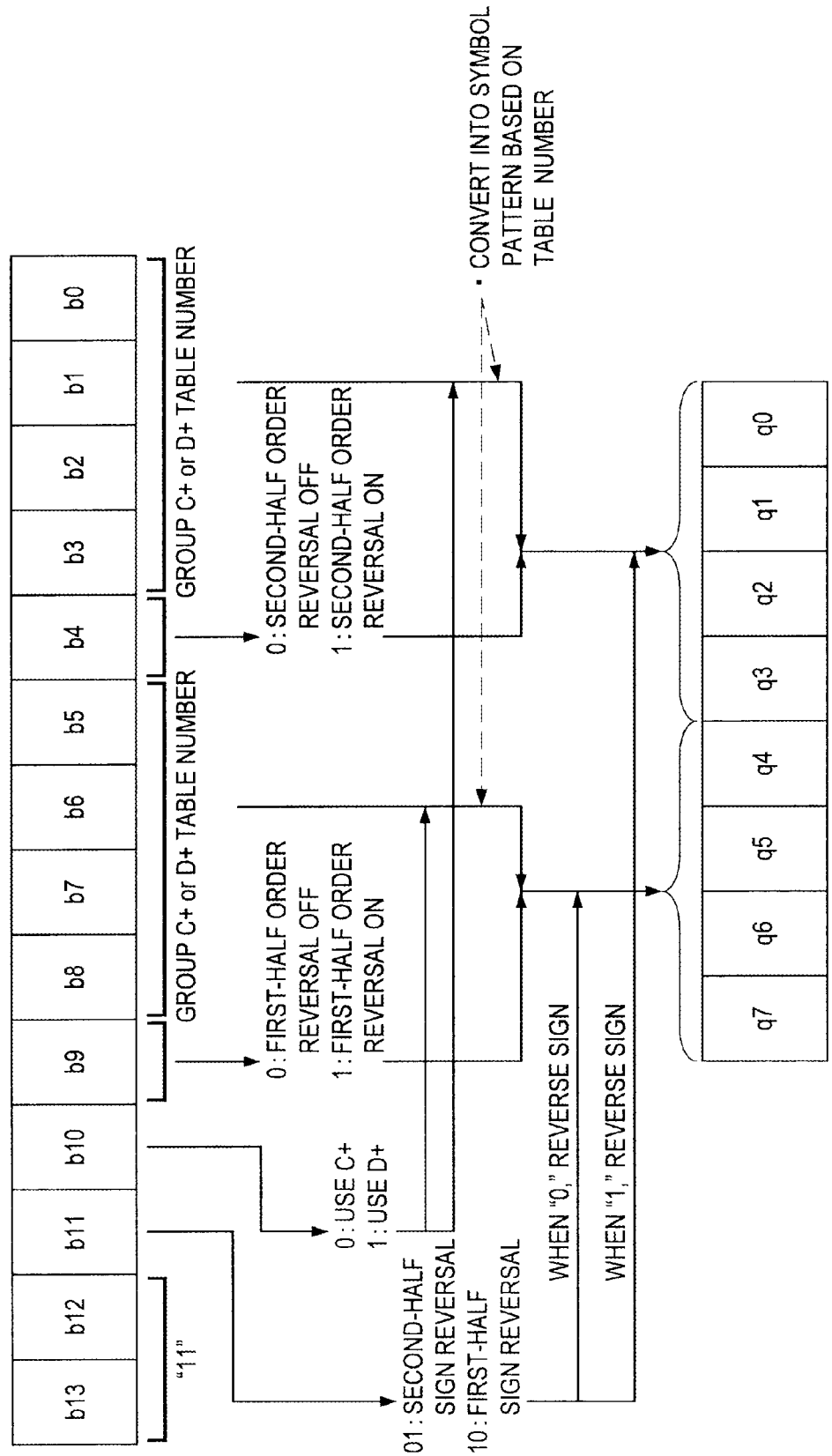
FIG. 14 is an explanatory diagram for describing the 14B8Q conversion method according to the embodiment.

Next, concrete encoding methods based on 14B8Q conversion will be described with reference to FIGS. 12 to 14. FIG. 12 is an explanatory diagram showing an encoding method that uses table A. FIG. 13 is an explanatory diagram showing an encoding method that uses table B. FIG. 14 is an explanatory diagram showing an encoding method that uses tables C and D.

(14B8Q Conversion by Table A)

First, 14B8Q conversion by table A will be described with reference to FIG. 12. When 14-bit bit sequence {b13, . . . , b1, b0} is input, the highest 2 bits {b13, b12} are referred to. Then, in the case the highest 2 bits are {00}, 14B8Q conversion by table A is performed.

As shown in FIG. 12, bit sequence {b10, . . . , b6} of the fourth to eighth bits (hereinafter, the first half) and bit sequence {b4, . . . , b0} of the tenth to fourteenth bits (hereinafter, the second half) are converted into symbol patterns based on table A. For example, in a case the bit sequence of the first half is {00011}, first, group A table No. {00011} corresponding to this bit sequence is referred to in table A. Then, symbol pattern {−2, 0, 2, 0} corresponding to group A table No. {00011} is read, and the bit sequence {00011} of the first half is converted into symbol pattern {−2, 0, 2, 0}. The same can be said for the bit sequence of the second half.

Furthermore, in the case bit value b11 of the third bit is 1, sign reversal is performed on the symbol pattern obtained by converting the bit sequence of the first half. On the other hand, in the case bit value b11 of the third bit is 0, sign reversal is not performed on the symbol pattern obtained by converting the bit sequence of the first half. Similarly, in the case bit value b5 of the ninth bit is 1, sign reversal is performed on the symbol pattern obtained by converting the bit sequence of the second half. On the other hand, in the case bit value b5 of the ninth bit is 0, sign reversal is not performed on the symbol pattern obtained by converting the bit sequence of the second half.

The 14-bit bit sequence is converted into a symbol pattern of the first-half 4 symbols and a symbol pattern of the second-half 4 symbols in this manner. The DC value of the symbol pattern of group A is 0. Thus, the DC value of the symbol pattern of 8 symbols obtained by combining the first-half 4 symbols and the second-half 4 symbols is 0.

(14B8Q Conversion by Table B)

Next, 14B8Q conversion by table B will be described with reference to FIG. 13. When 14-bit bit sequence {b13, . . . , b1, b0} is input, the highest 2 bits {b13, b12} are referred to. Then, in the case the highest 2 bits are {01} or {10}, 14B8Q conversion by table B is performed.

As shown in FIG. 13, bit sequence {b10, . . . , b6} of the fourth to eighth bits (hereinafter, the first half) and bit sequence {b4, . . . , b0} of the tenth to fourteenth bits (hereinafter, the second half) are converted into symbol patterns based on table B. For example, in a case the bit sequence of the first half is {00011}, first, group B table No. {00011} corresponding to this bit sequence is referred to in table B. Then, symbol pattern {−2, 1, 2, 0} corresponding to group B table No. {00011} is read, and the bit sequence {00011} of the first half is converted into symbol pattern {−2, 1, 2, 0}. The same can be said for the bit sequence of the second half.

Furthermore, in the case bit sequence {b13, b12} of the 2 bits mentioned above is {10}, sign reversal is performed on the symbol pattern obtained by converting the bit sequence of the first half. On the other hand, in the case bit sequence {b13, b12} of the 2 bits mentioned above is {01}, sign reversal is performed on the symbol pattern obtained by converting the bit sequence of the second half.

Furthermore, in the case bit value b11 of the third bit is 1, order reversal is performed on the symbol pattern obtained by converting the bit sequence of the first half. On the other hand, in the case bit value b11 of the third bit is 0, order reversal is not performed on the symbol pattern obtained by converting the bit sequence of the first half. Similarly, in the case bit value b5 of the ninth bit is 1, order reversal is performed on the symbol pattern obtained by converting the bit sequence of the second half. On the other hand, in the case bit value b5 of the ninth bit is 0, order reversal is not performed on the symbol pattern obtained by converting the bit sequence of the second half.

The 14-bit bit sequence is converted into a symbol pattern of the first-half 4 symbols and a symbol pattern of the second-half 4 symbols in this manner. The absolute value of the DC value of the symbol pattern of group B is 1. In the example of FIG. 13, since table B is configured from the symbol patterns belonging to group B+, the DC value is +1. However, sign reversal is performed on the first-half 4 symbols or the second-half 4 symbols, and thus the DC value of the symbol pattern of 8 symbols obtained by combining the first-half 4 symbols and the second-half 4 symbols is 0.

(14B8Q Conversion by Tables C, D)

Next, 14B8Q conversion by tables C, D will be described with reference to FIG. 14. When 14-bit bit sequence {b13, . . . , b1, b0} is input, the highest 2 bits {b13, b12} are referred to. Then, in the case the highest 2 bits are {11}, 14B8Q conversion by tables C, D is performed.

As shown in FIG. 14, bit sequence {b8, . . . , b5} of the sixth to ninth bits (hereinafter, the first half) and bit sequence {b3, . . . , b0} of the eleventh to fourteenth bits (hereinafter, the second half) are converted into symbol patterns based on tables C, D. Here, selection of whether table C is used or table D is used is performed based on bit value b10 of the fourth bit. In the case bit value b10 is 0, table C is used. On the other hand, in the case bit value b10 is 1, table D is used.

For example, in a case bit value b10 is 0 and the bit sequence of the first half is {0011}, first, group C table No. {0011} corresponding to this bit sequence is referred to in Table C. Then, symbol pattern {−1, 1, 2, 0} corresponding to group C table No. {0011} is read, and the bit sequence {0011} of the first half is converted into symbol pattern {−1, 1, 2, 0}. The same can be said for the bit sequence of the second half.

Furthermore, in the case bit value b11 of the third bit is 1, sign reversal is performed on the symbol pattern obtained by converting the bit sequence of the first half. On the other hand, in the case bit value b11 of the third bit is 0, sign reversal is performed on the symbol pattern obtained by converting the bit sequence of the second half.

Also, in the case bit value b9 of the fifth bit is 1, order reversal is performed on the symbol pattern obtained by converting the bit sequence of the first half. On the other hand, in the case bit value b9 of the fifth bit is 0, order reversal is not performed on the symbol pattern obtained by converting the bit sequence of the first half. Similarly, in the case bit value b4 of the tenth bit is 1, order reversal is performed on the symbol pattern obtained by converting the bit sequence of the second half. On the other hand, in the case bit value b4 of the tenth bit is 0, order reversal is not performed on the symbol pattern obtained by converting the bit sequence of the second half.

The 14-bit bit sequence is converted into a symbol pattern of the first-half 4 symbols and a symbol pattern of the second-half 4 symbols in this manner. The absolute value of the DC value of the symbol pattern of group C is 2. Also, the absolute value of the DC value of the symbol pattern of group D is 3. In the example of FIG. 14, since tables C and D are configured respectively from the symbol patterns belonging to groups C+ and D+, the DC values are respectively +2 and +3. However, sign reversal is performed on the first-half 4 symbols or the second-half 4 symbols, and thus the DC value of the symbol pattern of 8 symbols obtained by combining the first-half 4 symbols and the second-half 4 symbols is 0.

Heretofore, an encoding method based on 14B8Q conversion according to the present embodiment has been described. When using the encoding method described above, a symbol pattern of 8 quinary symbols whose DC value is 0 can be obtained by using a conversion table with small size. By using the encoding method described above, the amount of data transmitted with the same clock increases, and thus the transmission speed increases. For example, a transmission speed is obtained that is 1.75 times compared to a case of transmitting a 14-bit bit sequence by converting the same into an AMI code with a duty of 100%. Furthermore, since the transmission signal will be DC-free, deterioration of the transmission quality is not caused in a DC cutoff transmission line. Furthermore, since the size of the conversion table can be kept small, the circuit scale can be greatly reduced compared to a case of using 8B6T conversion.

<2-2: Functional Configuration of Mobile Terminal 100>

Figure 15:
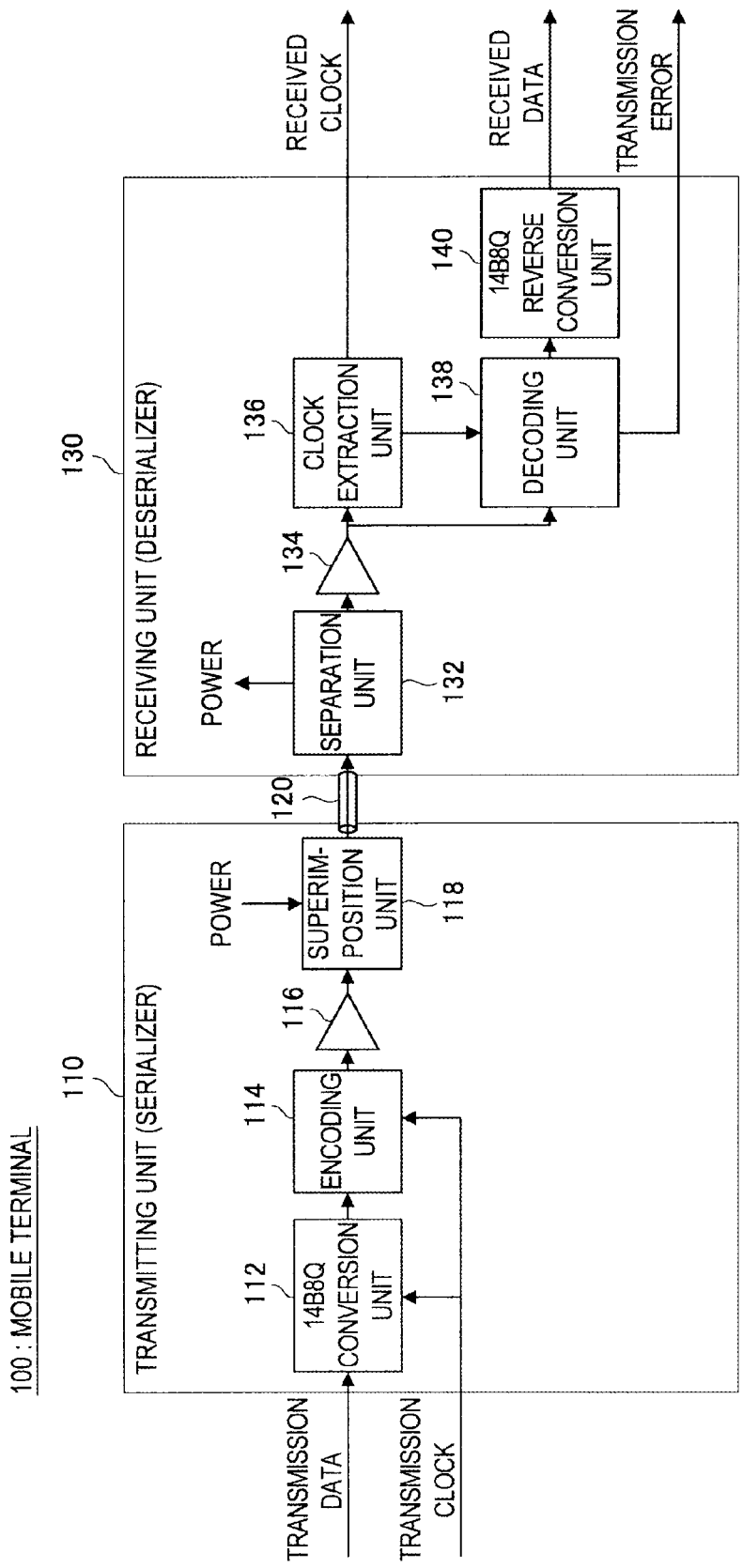
FIG. 15 is an explanatory diagram showing an example of a functional configuration of a mobile terminal capable of realizing the 14B8Q conversion method according to the embodiment.

Next, a functional configuration of a mobile terminal 100 capable of realizing the encoding method described above will be described with reference to FIG. 15. FIG. 15 is an explanatory diagram showing an example of a functional configuration of the mobile terminal 100 according to the present embodiment. Additionally, in the example of FIG. 15, the encoding method of the present embodiment and the encoding method of the new scheme are used in combination. Moreover, in the case of using only the encoding method of the present embodiment, modification may be made to have a PLL provided in a clock extraction unit 136 of a receiving unit 130, and to have a clock regenerated by using the PLL.

As shown in FIG. 15, the mobile terminal 100 is configured from a transmitting unit 110 (corresponding to a part of functions of the serializer 26, for example) and a receiving unit 130 (corresponding to a part of functions of the deserializer 30). Also, the transmitting unit 110 and the receiving unit 130 are electrically connected by a coaxial cable 120.

The transmitting unit 110 mainly includes a 14B8Q conversion unit 112, an encoding unit 114, a driver 116, and a superimposition unit 118. Also, the receiving unit 130 mainly includes a separation unit 132, a receiver 134, a clock extraction unit 136, a decoding unit 138, and a 14B8Q reverse conversion unit 140. A storage unit that is not shown is provided in the transmitting unit 110 and the receiving unit 130. Additionally, a configuration is shown in the example of FIG. 15 of superimposing a transmission signal on a direct current and transmitting the same, but the application scope of the present embodiment is not limited to such.

First, transmission data and a transmission clock are input to the transmitting unit 110. The transmission data is input to the 14B8Q conversion unit 112. Also, the transmission clock is input to the 14B8Q conversion unit 112 and the encoding unit 114. The 14B8Q conversion unit 112 14B8Q-converts the transmission data by using the tables A to D illustrated in FIGS. 8 to 11, and generates encoded data formed from quinary symbol sequences of 8 symbols. At this time, the 14B8Q conversion unit 112 generates the encoded data in accordance with the encoding methods shown in FIGS. 12 to 14. The encoded data generated by the 14B8Q conversion unit 112 is input to the encoding unit 114.

When the encoded data is input, the encoding unit 114 generates a multilevel transmission signal. Then, the multilevel transmission signal generated by the encoding unit 114 is input to the driver 116 and is converted to have an appropriate amplitude level.

The transmission signal on which level-conversion has been performed at the driver 116 is input to the superimposition unit 118. When the transmission signal is input, the superimposition unit 118 generates a superimposed signal by superimposing a power signal supplied from a DC power supply on the transmission signal. As described above, the multilevel transmission signal generated by the transmitting unit 110 hardly contains DC components. Therefore, even if the transmission signal is superimposed on the power signal, the transmission signal and the power signal can be easily separated by using various types of filters. As described, by superimposing the transmission signal on the power signal, both signals can be transmitted by one coaxial cable 120. As a result, the number of lines in the serial signal line can be reduced.

Now, the superimposed signal generated by the superimposition unit 118 is transmitted to the receiving unit 130 through the coaxial cable 120. Then, the superimposed signal transmitted through the coaxial cable 120 is input to the separation unit 132. When the superimposed signal is input, the separation unit 132 separates the transmission signal and the power signal from the superimposed signal. The power signal separated by the separation unit 132 is supplied to each structural element of the receiving unit 130 as power. On the other hand, the transmission signal separated by the separation unit 132 is received by the receiver 134, and is input to the clock extraction unit 136 and the decoding unit 138.

When the transmission signal is input, the clock extraction unit 136 regenerates a clock by using a PLL. The clock component that is regenerated is input to the decoding unit 138 as a received clock. This received clock is also output to the outside of the receiving unit 130.

Now, when the received clock is input, the decoding unit 138 determines, by using the input received clock, the amplitude level of the transmission signal with a specific threshold value as a reference. Then, the decoding unit 138 regenerates the encoded data formed from quinary symbol sequences of 8 symbols based on the determination result. The encoded data regenerated by the decoding unit 138 is input to the 14B8Q reverse conversion unit 140. When the encoded data is input, the 14B8Q reverse conversion unit 140 extracts, in units of 8 symbols, quinary symbols included in the encoded data, and restores the transmission data by performing reverse processes of the encoding methods shown in FIGS. 12 to 14.

At this time, the 14B8Q reverse conversion unit 140 refers to tables A to D, and restores a 14-bit bit sequence from a symbol pattern of 8 symbols. For example, in a case symbol pattern {−1, 0, 0, 1, 2, 1, −2, −1} of 8 symbols in input, the 14B8Q reverse conversion unit 140 calculates the DC value of the first-half 4 symbols. In this example, the DC value is 0, and thus the 14B8Q reverse conversion unit 140 attempts to perform reverse conversion to a bit sequence by using table A. Also, at this stage, the 14B8Q reverse conversion unit 140 determines the highest 2 bits of the bit sequence to be {00}.

Next, the 14B8Q reverse conversion unit 140 searches table A for symbol pattern {−1, 0, 0, 1} of the first-half 4 symbols. The symbol pattern {−1, 0, 0, 1} is included in table A, and is associated with group A table No. {01111}. Accordingly, the 14B8Q reverse conversion unit 140 perceives that sign reversal is not performed on the first-half 4 symbols and that the corresponding group A table number is {01111}. Then, the 14B8Q reverse conversion unit 140 determines the bit value of the third bit to be 0, and determines the bit sequence of the fourth to eighth bits to be {01111}.

Next, the 14B8Q reverse conversion unit 140 searches table A for symbol pattern {2, 1, −2, −1} of the second-half 4 symbols. However, the symbol pattern {2, 1, −2, −1} is not included in table A. Accordingly, the 14B8Q reverse conversion unit 140 searches table A for a symbol pattern {−2, −1, 2, 1} which is the symbol pattern of the second-half 4 symbols with the signs reversed. The symbol pattern {−2, −1, 2, 1} exists in table A, and is associated with group A table No. {00001}. Accordingly, the 14B8Q reverse conversion unit 140 perceives that sign reversal is performed on the second-half 4 symbols and that the corresponding group A table number is {00001}. Then, the 14B8Q reverse conversion unit 140 determines the bit value of the ninth bit to be 1, and determines the bit sequence of the tenth to fourteenth bits to be {00001}.

With the method described above, the 14B8Q reverse conversion unit 140 restores 14-bit bit sequence {00001111100001} from the symbol pattern {−1, 0, 0, 1, 2, 1, −2, −1} of 8 symbols. Similarly, symbol patterns that have been 14B8Q-converted by using tables B, C and D can also be restored to original bit sequences by using tables B, C and D. However, in the case of using tables B, C and D, in addition to an operation for identifying sign reversal, an operation for identifying order reversal becomes necessary. In this case, sign reversal/non-reversal and order reversal/non-reversal can be detected by sequentially searching a conversion table for a symbol pattern as it is, a symbol pattern with signs reversed and a symbol pattern with order reversed. Furthermore, which table is used can be determined by a DC value as with the case of table A described above.

The transmission data restored by the 14B8Q reverse conversion unit 140 in this manner is output to the outside of the receiving unit 130. For example, the transmission data restored by the 14B8Q reverse conversion unit 140 is output towards a display unit for displaying an image, for example. Additionally, the configuration described above can be modified as appropriate as long as it is within the technical scope of the present embodiment. For example, for the sake of explanation, the transmitting unit 110 and the receiving unit 130 are assumed here to be provided in one device. However, the transmitting unit 110 and the receiving unit 130 may be provided in separate devices.

Heretofore, the first embodiment of the present invention has been described. In the above, 14B8Q conversion has been taken as an example. However, by appropriately selecting M and N by the method described above, an effective encoding method by other MBNQ conversion can be realized as with the present embodiment. Such effective encoding method is of course within the technical scope of the present embodiment.

3: Second Embodiment

Next, the second embodiment of the present invention will be described. The present embodiment relates to 12B8Q (12 Binary 8 Quaternary) conversion of converting a 12-bit bit sequence into a quaternary (base-4) symbol sequence of 8 symbols.

<3-1: Encoding Method Based on 12B8Q Conversion>

In the following, an encoding method based on 12B8Q conversion will be described in detail.

(12B8Q Conversion)

Figure 16:
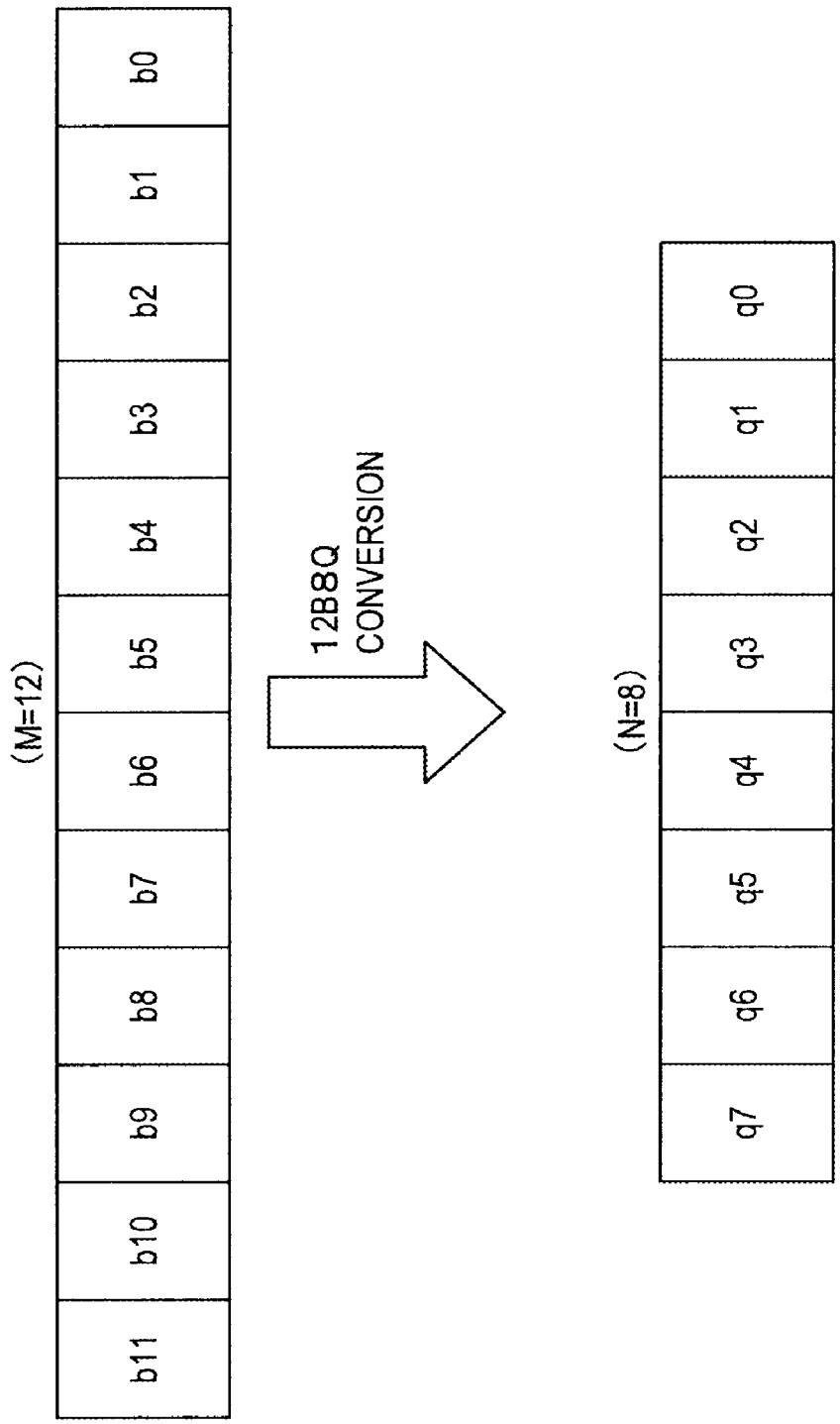
FIG. 16 is an explanatory diagram showing a 12B8Q conversion method according to a second embodiment of the present invention.
Figure 17:
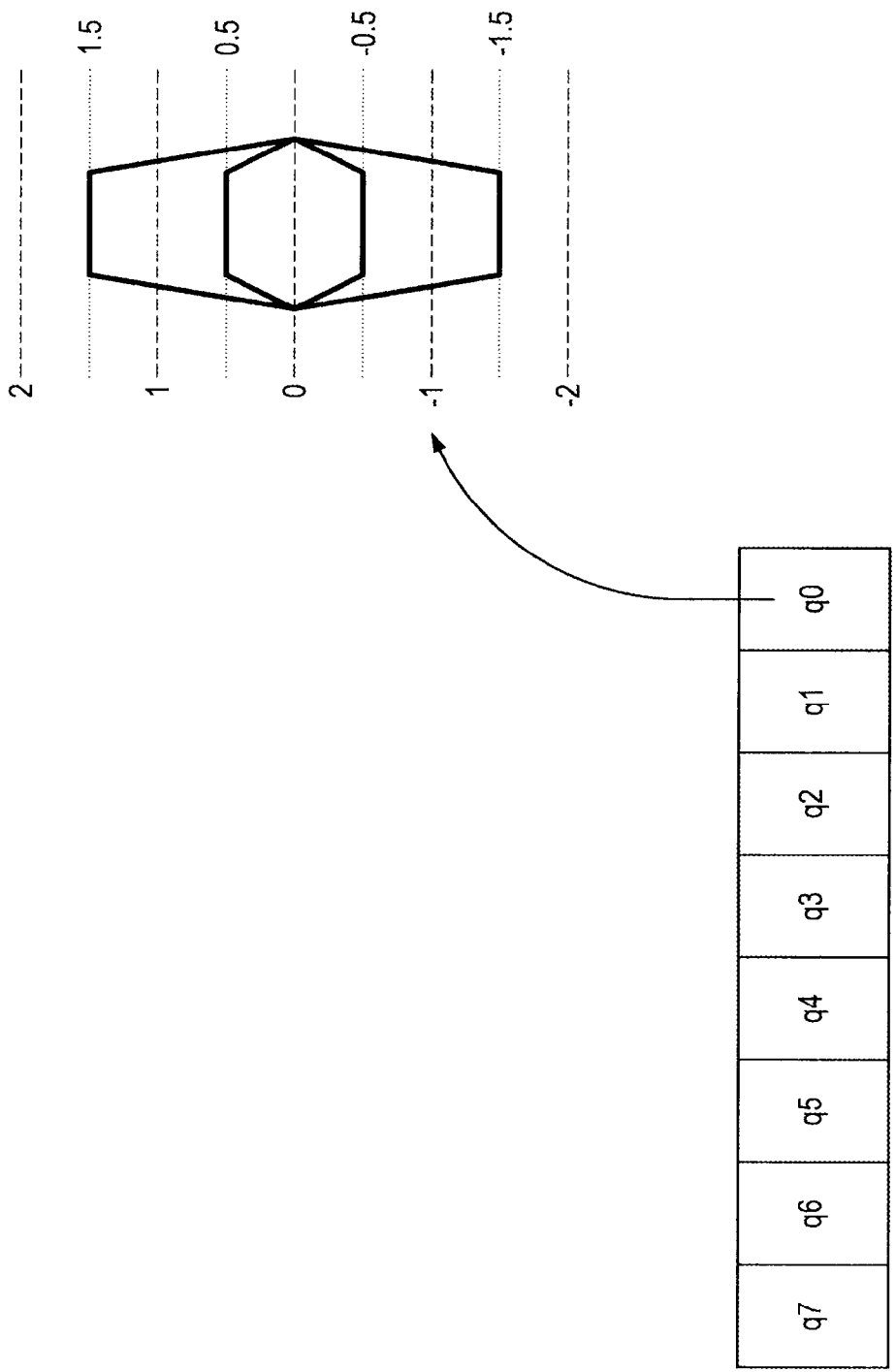
FIG. 17 is an explanatory diagram for describing the 12B8Q conversion method according to the embodiment.

First, 12B8Q conversion and a data transmission method based on 12B8Q conversion will be described with reference to FIGS. 16 and 17. As shown in FIG. 16, 12B8Q conversion is a method of converting a 12-bit bit sequence {b0, . . . , b11} into a quaternary symbol sequence of 8 symbols {q0, . . . , q7}. Additionally, as shown in FIG. 17, the (j+1)-th symbol qj (j=0 to 7) included in the quaternary symbol sequence takes a quaternary symbol value (for example, +1.5, +0.5, 0.5, −1.5). The quaternary symbol sequence generated by 12B8Q conversion is transmitted in the form of a transmission signal having the symbol value of each symbol as an amplitude. An eye pattern of this transmission signal will roughly take the form as shown on the right side in FIG. 17.

Here, consideration will be again given to a combination of M and N that allows realization of MBNQ conversion (M and N are natural numbers; M>N). The MBNQ conversion assumed here is a method of converting M-bit bit sequences {b0, . . . , b(M−1)} into a quaternary symbol sequence of N symbols {q0, . . . , q(N−1)}. Of course, when the number of combinations expressed by the quaternary symbol sequence of N symbols {q0, . . . , q(N−1)} is less than the number of combinations expressed by the M-bit bit sequences {b0, . . . , b(M−1)}, it is not possible to realize MBNQ conversion. The number of combinations for the M-bit bit sequence {b0, . . . , b(M−1)} is $2^M$. Also, the number of combinations for the quaternary symbol sequence of N symbols {q0, . . . , q(N−1)} is $4^N$. Accordingly, to realize MBNQ conversion, the condition $2^M < 4^N$ has to be satisfied.

Furthermore, in the case of M≦N, the transmission speed is M/N≦1 when compared to the case where the M-bit bit sequence is transmitted as it is, and thus the transmission speed is not increased even if MBNQ conversion is used. Accordingly, to realize effective MBNQ conversion, it is necessary to determine M and N that satisfy condition 1: $2^M < 4^N$ and condition 2: M>N. For example, 12B8Q conversion corresponds to a case where M=12 and N=8. Since $2^{12}$=4,096 and $4^8$=65,536, condition 1 is satisfied. Also, since M (=12)>N (=8), condition 2 is satisfied. Additionally, when using 12B8Q conversion, the transmission speed is increased by 12/8=1.5 times.

By selecting M and N so as to satisfy the above-described conditions 1 and 2, a combination of M and N capable of realizing MBNQ conversion can be determined. Also, by selecting a combination of M and N according to which M/N is large, the transmission speed can be increased. However, combinations for quaternary symbol sequence {q0, . . . , q(N−1)} include a large number of combinations whose DC values are not 0. If a combination in quaternary symbol sequence whose DC value is not 0 is used, a DC component will be included in the transmission signal and the signal quality will deteriorate in a DC cutoff transmission line. Therefore, it is desirable to define the conversion rule of MBNQ conversion by selecting a combination whose DC value is 0 among combinations for quaternary symbol sequence $\{q0, \ldots, q(N-1)\}$.

Figure 18:
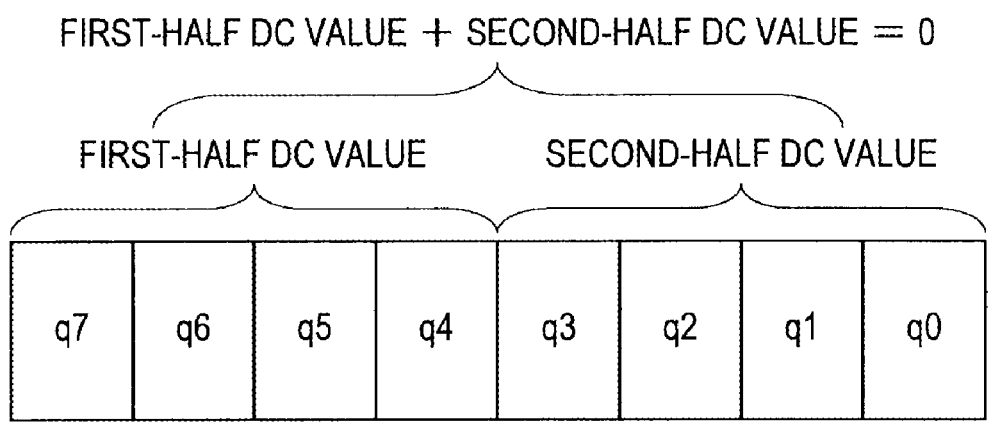
FIG. 18 is an explanatory diagram for describing the 12B8Q conversion method according to the embodiment.

However, the number of combinations for quaternary symbol sequences whose DC values are 0 is not so large. If condition 1 is changed to "$2^M$<the number of combinations for quaternary symbol sequence whose DC values are 0," only the combinations of M and N for which M/N is small will be obtained. Accordingly, to greatly increase the transmission speed, a method of suppressing the DC component in a transmission signal while using a combination in quaternary symbol sequence whose DC value is other than 0 is desired. In view of such issue, the inventor of the present invention has devised, as shown in FIG. 18, an encoding method of dividing a quaternary symbol sequence of 8 symbols into first-half 4 symbols and second-half 4 symbols and making the DC value of the whole quaternary symbol sequence of 8 symbols a 0.

In the case of the quaternary symbol sequence $\{q0, \ldots, q7\}$ illustrated in FIG. 17, the symbol value qj of each symbol takes a quaternary value of $-1.5, -0.5, +0.5$ or $+1.5$, and thus the DC value of the quaternary symbol sequence $\{q0, \ldots, q7\}$ will be up to 14 (=1.5*8). The encoding method of the present embodiment is a method of encoding a 12-bit bit sequence $\{b0, \ldots, b11\}$ such that the DC value of the first-half 4 symbols will be X (X is a real number) and the DC value of the second-half 4 symbols will be −X. As described, with the DC value of the first-half 4 symbols and the DC value of the second-half 4 symbols taking the same absolute value with one being positive and the other being negative, the DC value of the whole quaternary symbol sequence of 8 symbols will be 0. Additionally, in the encoding method of the present embodiment, combinations of 4 symbols the absolute values of whose DC values are 3 or less will be used in consideration of influence of a DC value change over a short period of time (a 4-symbol period).

First, quaternary symbol sequences of 4 symbols are grouped for each DC value. For example, a group of DC value=0 is expressed as group A, a group of DC value=+1 as group B+, and a group of DC value=−1 as group B−. Also, a group of DC value=+2 is expressed as group C+, a group of DC value=−2 as group C−, a group of DC value=+3 as group D+, and a group of DC value=−3 as group C−. Additionally, as with the first embodiment described above, the size of a conversion table is reduced also in the present embodiment by using sign reversal and order reversal.

FIGS. 19 and 20 are examples of conversion tables whose sizes are reduced by sign reversal or a combination of sign reversal and order reversal.

FIG. 19 is a conversion table (hereinafter, table A) for converting a specific bit sequence (hereinafter, group A table number) into a symbol pattern belonging to group A. For example, a conversion rule for converting group A table No. {0001} into symbol pattern {−1.5, 0.5, 1.5, −0.5} is recorded in table A. Also, FIG. 20 is a conversion table (hereinafter, table B) for converting a specific bit sequence (hereinafter, group B table number) into a symbol pattern belonging to group B. For example, a conversion rule for converting group B table No. {0001} into symbol pattern {−1.5, 1.5, −0.5, 1.5} is recorded in table B.

FIG. 21 is a conversion table (hereinafter, table C) for converting a specific bit sequence (hereinafter, group C table number) into a symbol pattern belonging to group C. For example, a conversion rule for converting group C table No. {0001} into symbol pattern {−0.5, 1.5, −0.5, 1.5} is recorded in table C. Also, FIG. 22 is a conversion table (hereinafter, table D) for converting a specific bit sequence (hereinafter, group D table number) into a symbol pattern belonging to group D. For example, a conversion rule for converting group D table No. {0001} into symbol pattern {−0.5, 0.5, 1.5, 1.5} is recorded in table D.

Additionally, structures of tables A to D before and after sign reversal and before and after order reversal are illustrated in FIGS. 23 to 26 for reference. Also, symbol patterns that are not actually used as conversion rules are also shown in FIGS. 23 to 26 (symbol patterns with "*" mark in the column "unused"). As shown in FIGS. 23 to 26, with respect to table A, the number of symbol patterns is reduced to half by sign reversal. Also, table B+ or B−, table C+ or C−, and table D+ or D− can be omitted by sign reversal. Furthermore, with respect to tables B, C and D, the number of symbol patterns can be greatly reduced by order reversal. Then, by extracting and using only the necessary number of symbol patterns, conversion tables with small sizes as shown in FIGS. 19 to 21 can be obtained.

(Concrete Encoding Method)

Next, concrete encoding methods based on 12B8Q conversion will be described with reference to FIGS. 27 to 29. FIG. 27 is an explanatory diagram showing an encoding method that uses table A. FIG. 28 is an explanatory diagram showing an encoding method that uses table B. FIG. 29 is an explanatory diagram showing an encoding method that uses tables C and D.

(12B8Q Conversion by Table A)

First, 12B8Q conversion by table A will be described with reference to FIG. 27. When 12-bit bit sequence $\{b11, \ldots, b1, b0\}$ is input, the highest 2 bits $\{b11, b10\}$ are referred to. Then, in the case the highest 2 bits are {00}, 12B8Q conversion by table A is performed.

As shown in FIG. 27, bit sequence $\{b8, \ldots, b5\}$ of the fourth to seventh bits (hereinafter, the first half) and bit sequence $\{b3, \ldots, b0\}$ of the ninth to twelfth bits (hereinafter, the second half) are converted into symbol patterns based on table A. For example, in a case the bit sequence of the first half is {0011}, first, group A table No. {0011} corresponding to this bit sequence is referred to in table A. Then, symbol pattern {−1.5, 1.5, −0.5, 0.5} corresponding to group A table No. {0011} is read, and the bit sequence {0011} of the first half is converted into symbol pattern {−1.5, 1.5, −0.5, 0.5}. The same can be said for the bit sequence of the second half.

Furthermore, in the case bit value b9 of the third bit is 1, sign reversal is performed on the symbol pattern obtained by converting the bit sequence of the first half. On the other hand, in the case bit value b9 of the third bit is 0, sign reversal is not performed on the symbol pattern obtained by converting the bit sequence of the first half. Similarly, in the case bit value b4 of the eighth bit is 1, sign reversal is performed on the symbol pattern obtained by converting the bit sequence of the second half. On the other hand, in the case bit value b4 of the eighth bit is 0, sign reversal is not performed on the symbol pattern obtained by converting the bit sequence of the second half.

The 12-bit bit sequence is converted into a symbol pattern of the first-half 4 symbols and a symbol pattern of the second-half 4 symbols in this manner. The DC value of the symbol pattern of group A is 0. Thus, the DC value of the symbol pattern of 8 symbols obtained by combining the first-half 4 symbols and the second-half 4 symbols is 0.

(12B8Q Conversion by Table B)

Next, 12B8Q conversion by table B will be described with reference to FIG. 28. When 12-bit bit sequence $\{b11, \ldots, b1,$ b0} is input, the highest 2 bits {b11, b10} are referred to. Then, in the case the highest 2 bits are {01} or {10}, 12B8Q conversion by table B is performed.

As shown in FIG. 28, bit sequence {b8, . . . , b5} of the fourth to seventh bits (hereinafter, the first half) and bit sequence {b3, . . . , b0} of the tenth to twelfth bits (hereinafter, the second half) are converted into symbol patterns based on table B. For example, in a case the bit sequence of the first half is {0011}, first, group B table No. {0011} corresponding to this bit sequence is referred to in table B. Then, symbol pattern {−0.5, −1.5, 1.5, 1.5} corresponding to group B table No. {0011} is read, and the bit sequence {0011} of the first half is converted into symbol pattern {−0.5, −1.5, 1.5, 1.5}. The same can be said for the bit sequence of the second half.

Furthermore, in the case bit sequence {b11, b10} of the 2 bits mentioned above is {10}, sign reversal is performed on the symbol pattern obtained by converting the bit sequence of the first half. On the other hand, in the case bit sequence {b11, b10} of the 2 bits mentioned above is {01}, sign reversal is performed on the symbol pattern obtained by converting the bit sequence of the second half.

Furthermore, in the case bit value b9 of the third bit is 1, order reversal is performed on the symbol pattern obtained by converting the bit sequence of the first half. On the other hand, in the case bit value b9 of the third bit is 0, order reversal is not performed on the symbol pattern obtained by converting the bit sequence of the first half. Similarly, in the case bit value b4 of the eighth bit is 1, order reversal is performed on the symbol pattern obtained by converting the bit sequence of the second half. On the other hand, in the case bit value b4 of the eighth bit is 0, order reversal is not performed on the symbol pattern obtained by converting the bit sequence of the second half.

The 12-bit bit sequence is converted into a symbol pattern of the first-half 4 symbols and a symbol pattern of the second-half 4 symbols in this manner. The absolute value of the DC value of the symbol pattern of group B is 1. In the example of FIG. 28, since table B is configured from the symbol patterns belonging to group B+, the DC value is +1. However, sign reversal is performed on the first-half 4 symbols or the second-half 4 symbols, and thus the DC value of the symbol pattern of 8 symbols obtained by combining the first-half 4 symbols and the second-half 4 symbols is 0.

(12B8Q Conversion by Tables C, D)

Next, 12B8Q conversion by tables C, D will be described with reference to FIG. 29. When 12-bit bit sequence {b11, . . . , b1, b0} is input, the highest 2 bits {b11, b10} are referred to. Then, in the case the highest 2 bits are {11}, 12B8Q conversion by tables C, D is performed.

As shown in FIG. 29, bit sequence {b6, . . . , b4} of the sixth to eighth bits (hereinafter, the first half) and bit sequence {b2, . . . , b0} of the ninth to twelfth bits (hereinafter, the second half) are converted into symbol patterns based on tables C, D. Here, selection of whether table C is used or table D is used is performed based on bit value b8 of the fourth bit. In the case bit value b8 is 0, table C is used. On the other hand, in the case bit value b8 is 1, table D is used.

For example, in a case bit value b8 is 0 and the bit sequence of the first half is {011}, first, group C table No. {011} corresponding to this bit sequence is referred to in Table C. Then, symbol pattern {0.5, −0.5, 0.5, 1.5} corresponding to group C table No. {011} is read, and the bit sequence {011} of the first half is converted into symbol pattern {0.5, −0.5, 0.5, 1.5}. The same can be said for the bit sequence of the second half.

Furthermore, in the case bit value b9 of the third bit is 1, sign reversal is performed on the symbol pattern obtained by converting the bit sequence of the first half. On the other hand, in the case bit value b9 of the third bit is 0, sign reversal is performed on the symbol pattern obtained by converting the bit sequence of the second half.

Also, in the case bit value b7 of the fifth bit is 1, order reversal is performed on the symbol pattern obtained by converting the bit sequence of the first half. On the other hand, in the case bit value b7 of the fifth bit is 0, order reversal is not performed on the symbol pattern obtained by converting the bit sequence of the first half. Similarly, in the case bit value b3 of the ninth bit is 1, order reversal is performed on the symbol pattern obtained by converting the bit sequence of the second half. On the other hand, in the case bit value b3 of the ninth bit is 0, order reversal is not performed on the symbol pattern obtained by converting the bit sequence of the second half.

The 12-bit bit sequence is converted into a symbol pattern of the first-half 4 symbols and a symbol pattern of the second-half 4 symbols in this manner. The absolute value of the DC value of the symbol pattern of group C is 2. Also, the absolute value of the DC value of the symbol pattern of group D is 3. In the example of FIG. 29, since tables C and D are configured respectively from the symbol patterns belonging to groups C+ and D+, the DC values are respectively +2 and +3. However, sign reversal is performed on the first-half 4 symbols or the second-half 4 symbols, and thus the DC value of the symbol pattern of 8 symbols obtained by combining the first-half 4 symbols and the second-half 4 symbols is 0.

Heretofore, an encoding method based on 12B8Q conversion according to the present embodiment has been described. When using the encoding method described above, a symbol pattern of 8 quaternary symbols whose DC value is 0 can be obtained by using a conversion table with small size. By using the encoding method described above, the amount of data transmitted with the same clock increases, and thus the transmission speed increases. For example, a transmission speed is obtained that is 1.5 times compared to a case of transmitting a 12-bit bit sequence by converting the same into an AMI code with a duty of 100%. Furthermore, since the transmission signal will be DC-free, deterioration of the transmission quality is not caused in a DC cutoff transmission line. Furthermore, since the size of the conversion table can be kept small, the circuit scale can be greatly reduced compared to a case of using 8B6T conversion.

<3-2: Functional Configuration of Mobile Terminal 100>

Next, a functional configuration of a mobile terminal 100 capable of realizing the encoding method described above will be described with reference to FIG. 30. FIG. 30 is an explanatory diagram showing an example of a functional configuration of the mobile terminal 100 according to the present embodiment. Additionally, in the example of FIG. 30, the encoding method of the present embodiment and the encoding method of the new scheme are used in combination. Moreover, in the case of using only the encoding method of the present embodiment, modification may be made to have a PLL provided in a clock extraction unit 136 of a receiving unit 130, and to have a clock regenerated by using the PLL.

As shown in FIG. 30, the mobile terminal 100 is configured from a transmitting unit 110 (corresponding to a part of functions of the serializer 26, for example) and a receiving unit 130 (corresponding to a part of functions of the deserializer 30). Also, the transmitting unit 110 and the receiving unit 130 are electrically connected by a coaxial cable 120.

The transmitting unit 110 mainly includes a 12B8Q conversion unit 152, an encoding unit 114, a driver 116, and a superimposition unit 118. Also, the receiving unit 130 mainly includes a separation unit 132, a receiver 134, a clock extraction unit 136, a decoding unit 138, and a 12B8Q reverse conversion unit 154. A storage unit that is not shown is provided in the transmitting unit 110 and the receiving unit 130. Additionally, a configuration is shown in the example of FIG. 30 of superimposing a transmission signal on a direct current and transmitting the same, but the application scope of the present embodiment is not limited to such.

First, transmission data and a transmission clock are input to the transmitting unit 110. The transmission data is input to the 12B8Q conversion unit 152. Also, the transmission clock is input to the 12B8Q conversion unit 152 and the encoding unit 114. The 12B8Q conversion unit 152 12B8Q-converts the transmission data by using the tables A to D illustrated in FIGS. 19 to 22, and generates encoded data formed from quaternary symbol sequences of 8 symbols. At this time, the 12B8Q conversion unit 152 generates the encoded data in accordance with the encoding methods shown in FIGS. 27 to 29. The encoded data generated by the 12B8Q conversion unit 152 is input to the encoding unit 114.

When the encoded data is input, the encoding unit 114 generates a multilevel transmission signal. Then, the multilevel transmission signal generated by the encoding unit 114 is input to the driver 116 and is converted to have an appropriate amplitude level.

The transmission signal on which level-conversion has been performed at the driver 116 is input to the superimposition unit 118. When the transmission signal is input, the superimposition unit 118 generates a superimposed signal by superimposing a power signal supplied from a DC power supply on the transmission signal. As described above, the multilevel transmission signal generated by the transmitting unit 110 hardly contains DC components. Therefore, even if the transmission signal is superimposed on the power signal, the transmission signal and the power signal can be easily separated by using various types of filters. As described, by superimposing the transmission signal on the power signal, both signals can be transmitted by one coaxial cable 120. As a result, the number of lines in the serial signal line can be reduced.

Now, the superimposed signal generated by the superimposition unit 118 is transmitted to the receiving unit 130 through the coaxial cable 120. Then, the superimposed signal transmitted through the coaxial cable 120 is input to the separation unit 132. When the superimposed signal is input, the separation unit 132 separates the transmission signal and the power signal from the superimposed signal. The power signal separated by the separation unit 132 is supplied to each structural element of the receiving unit 130 as power. On the other hand, the transmission signal separated by the separation unit 132 is received by the receiver 134, and is input to the clock extraction unit 136 and the decoding unit 138.

When the transmission signal is input, the clock extraction unit 136 regenerates a clock by using a PLL. The clock component that is regenerated is input to the decoding unit 138 as a received clock. This received clock is also output to the outside of the receiving unit 130.

Now, when the received clock is input, the decoding unit 138 determines, by using the input received clock, the amplitude level of the transmission signal with a specific threshold value as a reference. Then, the decoding unit 138 regenerates the encoded data formed from quaternary symbol sequences of 8 symbols based on the determination result. The encoded data regenerated by the decoding unit 138 is input to the 12B8Q reverse conversion unit 154. When the encoded data is input, the 12B8Q reverse conversion unit 154 extracts, in units of 8 symbols, quaternary symbols included in the encoded data, and restores the transmission data by performing reverse processes of the encoding methods shown in FIGS. 27 to 29.

At this time, the 12B8Q reverse conversion unit 154 refers to tables A to D, and restores a 12-bit bit sequence from a symbol pattern of 8 symbols. For example, in a case symbol pattern {−0.5, 1.5, 0.5, −1.5, 0.5, 0.5, −0.5, −0.5} of 8 symbols is input, the 12B8Q reverse conversion unit 154 calculates the DC value of the first-half 4 symbols. In this example, the DC value is 0, and thus the 12B8Q reverse conversion unit 154 attempts to perform reverse conversion to a bit sequence by using table A. Also, at this stage, the 12B8Q reverse conversion unit 154 determines the highest 2 bits of the bit sequence to be {00}.

Next, the 12B8Q reverse conversion unit 154 searches table A for symbol pattern {−0.5, 1.5, 0.5, −1.5} of the first-half 4 symbols. The symbol pattern {−0.5, 1.5, 0.5, −1.5} is included in table A, and is associated with group A table No. {1111}. At this stage, the 12B8Q reverse conversion unit 154 perceives that sign reversal is not performed on the first-half 4 symbols and that the corresponding group A table number is {1111}. Then, the 12B8Q reverse conversion unit 154 determines the bit value of the third bit to be 0, and determines the bit sequence of the fourth to seventh bits to be {1111}.

Next, the 12B8Q reverse conversion unit 154 searches table A for symbol pattern {0.5, 0.5, −0.5, −0.5} of the second-half 4 symbols. However, the symbol pattern {0.5, 0.5, −0.5, −0.5} is not included in table A. Accordingly, the 12B8Q reverse conversion unit 154 searches table A for a symbol pattern {−0.5, −0.5, 0.5, 0.5} which is the symbol pattern of the second-half 4 symbols with the signs reversed.

The symbol pattern {−0.5, −0.5, 0.5, 0.5} exists in table A, and is associated with group A table No. {1000}. Accordingly, the 12B8Q reverse conversion unit 154 perceives that sign reversal is performed on the second-half 4 symbols and that the corresponding group A table number is {1000}. Then, the 12B8Q reverse conversion unit 154 determines the bit value of the eighth bit to be 1, and determines the bit sequence of the ninth to twelfth bits to be {1000}.

With the method described above, the 12B8Q reverse conversion unit 154 restores 12-bit bit sequence {000111111000} from the symbol pattern {−0.5, 1.5, 0.5, −1.5, 0.5, 0.5, −0.5, −0.5} of 8 symbols. Similarly, symbol patterns that have been 12B8Q-converted by using tables B, C and D can also be restored to original bit sequences by using tables B, C and D.

However, in the case of using tables B, C and D, in addition to an operation for identifying sign reversal, an operation for identifying order reversal becomes necessary. In this case, sign reversal/non-reversal and order reversal/non-reversal can be detected by sequentially searching a conversion table for a symbol pattern as it is, a symbol pattern with signs reversed and a symbol pattern with order reversed. Furthermore, which table is used can be determined by a DC value as with the case of table A described above.

The transmission data restored by the 12B8Q reverse conversion unit 154 in this manner is output to the outside of the receiving unit 130. For example, the transmission data restored by the 12B8Q reverse conversion unit 154 is output towards a display unit for displaying an image, for example. Additionally, the configuration described above can be modified as appropriate as long as it is within the technical scope of the present embodiment. For example, for the sake of explanation, the transmitting unit 110 and the receiving unit 130 are assumed here to be provided in one device. However, the transmitting unit 110 and the receiving unit 130 may be provided in separate devices.

Heretofore, the second embodiment of the present invention has been described. In the above, 12B8Q conversion has been taken as an example. However, by appropriately selecting M and N by the method described above, an effective encoding method by other MBNQ conversion can be realized as with the present embodiment. Such effective encoding method is of course within the technical scope of the present embodiment.

4: Summary

Lastly, the technical contents according to the embodiment of the present invention will be briefly described. The technical contents stated here can be applied to various information processing apparatuses, such as a personal computer, a mobile phone, a portable game machine, a portable information terminal, an information appliance, a car navigation system, and the like.

The functional configuration of the information processing apparatus described above can be expressed as follows. This information processing apparatus includes an encoding unit as described below. The encoding unit converts, based on a first conversion rule group according to which a total value for a base-K symbol sequence is X and a second conversion rule group according to which the total value for the base-K symbol sequence is −X among conversion rule groups for converting an L-bit bit sequence into the base-K symbol sequence (K>2) of N/2 symbol, an M-bit (M≧2*L) bit sequence into the base-K symbol sequence of N symbols. Particularly, when converting the M-bit bit sequence into the base-K symbol sequence of N symbols, the encoding unit converts a first-half N/2 symbol based on the first conversion rule group and converts a second-half N/2 symbol based on the second conversion rule group.

As described above, when converting an M-bit bit sequence into a symbol sequence of N symbols, the information processing apparatus according to the present embodiment performs conversion such that the symbol sequence of a first-half N/2 symbol takes a total value of X and the symbol sequence of a second-half N/2 symbol takes a total value of −X. As a result, the total of the symbol values for the whole symbol sequence of N symbols will be X+(−X)=0. Furthermore, with the M-bit bit sequence being converted into a base-K symbol sequence of N symbols, the bit rate is increased.

That is, by using this conversion method, a DC-free transmission signal with high transmission efficiency is obtained. Signal deterioration in a DC cutoff transmission line does not occur for a DC-free transmission signal. Accordingly, this transmission signal can be transmitted, being superimposed on a DC power. Also, by performing a conversion process with the first-half N/2 symbol and the second-half N/2 symbol divided from each other, a DC-free transmission signal can be generated by using a conversion rule by which a symbol sequence including a DC component is obtained. That is, an efficient usage of a conversion rule becomes possible.

(Notes)

The 14B8Q conversion unit 112 and the 12B8Q conversion unit 152 are examples of the encoding unit, a conversion rule determination unit, and a conversion processing unit. The storage unit provided in the 14B8Q conversion unit 112 and the 12B8Q conversion unit 152 is an example of a conversion rule storage unit. The configuration of the mobile terminal 100 described above may be applied to the mobile terminal 10 described above. In this case, the baseband processor 22 is an example of an arithmetic processing unit. The encoding unit 114 and the driver 116 are examples of a data transmitting unit of the mobile terminal 100. The decoding unit 138, the 14B8Q reverse conversion unit 140 and the 12B8Q reverse conversion unit 154 are examples of a restoration unit.

It should be understood by those skilled in the art that various modifications, combinations, sub-combinations and alterations may occur depending on design requirements and other factors insofar as they are within the scope of the appended claims or the equivalents thereof.

For example, 14B8Q conversion is taken as an example in the first embodiment described above, and 12B8Q conversion is taken as an example in the second embodiment described above. However, the technology of the first embodiment can be extended to a conversion rule for converting an X-bit bit sequence into a base-Z symbol sequence of Y symbols, where the combination of X, Y and Z is other than X=14, Y=8 and Z=5. Also, the technology of the second embodiment can be extended to a conversion rule for converting an X-bit bit sequence into a base-Z symbol sequence of Y symbols, where the combination of X, Y and Z is other than X=12, Y=8 and Z=4.

The present application contains subject matter related to that disclosed in Japanese Priority Patent Application JP 2009-250804 filed in the Japan Patent Office on Oct. 30, 2009, the entire content of which is hereby incorporated by reference.

What is claimed is:

1. An encoding apparatus comprising:
    an encoding unit to convert, based on a first conversion rule group according to which a total value for a base-K symbol sequence is X and a second conversion rule group according to which the total value for the base-K symbol sequence is −X among a plurality of conversion rule groups for converting an L-bit bit sequence into the base-K symbol sequence (K>2) of N/2 symbol, an M-bit (M≧2*L) bit sequence into the base-K symbol sequence of N symbols,
    wherein, when converting the M-bit bit sequence into the base-K symbol sequence of N symbols, the encoding unit converts a first-half N/2 symbol based on the first conversion rule group and converts a second-half N/2 symbol based on the second conversion rule group.

2. The encoding apparatus according to claim 1, wherein the encoding unit stores, with respect to a pair of conversion rules, among conversion rules included in the first or second conversion rule group, that will be a same conversion rule when positive/negative reversal is performed on each base-K symbol in the base-K symbol sequence corresponding to the L-bit bit sequence, only a first conversion rule of the pair and, when conversion is to be performed based on a second conversion rule of the pair, uses the first conversion rule by performing positive/negative reversal on each base-K symbol of the first conversion rule.

3. The encoding apparatus according to claim 2, wherein, in a case that the second conversion rule includes a base-K symbol sequence, which is obtained by sequentially reading each base-K symbol from an end of the base-K symbol sequence of the first conversion rule, corresponding to the L-bit bit sequence, the encoding unit stores only the first conversion rule and, when conversion is to be performed based on the second conversion rule, uses the base-K symbol sequence of the first conversion rule by sequentially reading the base-K symbol from the end.

4. The encoding apparatus according to claim 3,
    wherein the encoding unit includes
        a conversion rule storage unit to store a conversion rule group Rj excluding, from the first or second conversion group according to which a total value for the base-K symbol sequence is Xj (j=1, ..., J) or −Xj, a third conversion rule that can be expressed by positive/negative reversal of the base-K symbol and a fourth conversion rule that can be expressed by reading the base-K symbol sequence in a reverse order, a conversion rule determination unit to express the M-bit bit sequence by using two L-bit bit sequences, a first specific bit sequence indicating a type j of the conversion rule group Rj used for converting the L-bit bit sequences into base-K symbol sequences of N/2 symbol, a second specific bit sequence indicating whether or not positive/negative reversal is to be performed on the base-K symbol sequence of N/2 symbol of each L-bit bit sequence and a third specific bit sequence indicating a reading order of the base-K symbol sequence of N/2 symbol of each L-bit bit sequence, and to determine a conversion rule for converting the M-bit bit sequence into the base-K symbol sequence of N symbols, and a conversion processing unit to convert the M-bit bit sequence into the base-K symbol sequence of N symbols by using the conversion rule group Rj stored in the conversion rule storage unit, based on the conversion rule determined by the conversion rule determination unit.

5. The encoding apparatus according to claim 4, further comprising:

an arithmetic processing unit to input to the encoding unit data relating to display of an image in units of M bits;

a data transmitting unit to transmit the base-K symbol sequence obtained by conversion by the encoding unit;

a restoration unit to restore the data from the base-K symbol sequence transmitted by the data transmitting unit; and a display unit to display the image based on the data restored by the restoration unit.

6. An encoding method comprising the step of:

converting, based on a first conversion rule group according to which a total value for a base-K symbol sequence is X and a second conversion rule group according to which the total value for the base-K symbol sequence is −X among a plurality of conversion rule groups for converting an L-bit bit sequence into the base-K symbol sequence (K>2) of N/2 symbol, an M-bit (M≧2*L) bit sequence into the base-K symbol sequence of N symbols, wherein, when converting the M-bit bit sequence into the base-K symbol sequence of N symbols in the step of converting, a first-half N/2 symbol is converted based on the first conversion rule group and a second-half N/2 symbol is converted based on the second conversion rule group.

7. A computer-readable medium on which is stored a program which, when implemented, by a computer causes the computer to realize:

an encoding function of converting, based on a first conversion rule group according to which a total value for a base-K symbol sequence is X and a second conversion rule group according to which the total value for the base-K symbol sequence is −X among a plurality of conversion rule groups for converting an L-bit bit sequence into the base-K symbol sequence (K>2) of N/2 symbol, an M-bit (M≧2*L) bit sequence into the base-K symbol sequence of N symbols, wherein, when converting the M-bit bit sequence into the base-K symbol sequence of N symbols, the encoding function converts a first-half N/2 symbol based on the first conversion rule group and converts a second-half N/2 symbol based on the second conversion rule group.

* * * * *